United States Patent [19]
Bertin et al.

[11] Patent Number: 5,781,031
[45] Date of Patent: Jul. 14, 1998

[54] PROGRAMMABLE LOGIC ARRAY

[75] Inventors: Claude Louis Bertin, Burlington; John Edward Cronin, Milton, both of Vt.

[73] Assignee: International Business Machines Corporation, Armonk, N.Y.

[21] Appl. No.: 560,250

[22] Filed: Nov. 21, 1995

[51] Int. Cl.$^6$ .................... H03K 19/177; H01L 23/02
[52] U.S. Cl. .................. 326/39; 326/38; 326/41; 365/189.08; 257/686; 257/777
[58] Field of Search .................. 326/38–41, 44–45; 257/777–778, 686; 365/189.08

[56] References Cited

U.S. PATENT DOCUMENTS

| | | | |
|---|---|---|---|
| 4,140,967 | 2/1979 | Balasubramanian et al. | 324/73 R |
| 4,158,239 | 6/1979 | Bertin | 365/182 |
| 4,177,452 | 12/1979 | Balasubramanian et al. | 340/166 R |
| 4,212,026 | 7/1980 | Balasubramanian et al. | 357/41 |
| 4,266,282 | 5/1981 | Henle et al. | 365/52 |
| 4,388,704 | 6/1983 | Bertin et al. | 365/154 |
| 4,426,689 | 1/1984 | Henle et al. | 365/52 |
| 4,467,342 | 8/1984 | Tower . | |
| 4,500,905 | 2/1985 | Shibata | 357/68 |
| 4,612,083 | 9/1986 | Yasumoto et al. | 156/633 |
| 4,706,166 | 11/1987 | Go | 361/403 |
| 4,754,316 | 6/1988 | Reid . | |
| 4,761,681 | 8/1988 | Reid . | |
| 4,801,992 | 1/1989 | Golubic . | |
| 4,886,987 | 12/1989 | Usami | 326/45 |
| 4,887,338 | 12/1989 | Handler | 24/306 |
| 4,887,339 | 12/1989 | Bellanger | 24/575 |
| 4,894,706 | 1/1990 | Sato et al. . | |
| 4,897,708 | 1/1990 | Clements . | |
| 4,912,677 | 3/1990 | Itano et al. | 326/44 |
| 4,939,568 | 7/1990 | Kato et al. | 357/75 |
| 4,950,173 | 8/1990 | Minemura et al. | 439/82 |
| 4,959,564 | 9/1990 | Steele | 326/38 |
| 4,999,311 | 3/1991 | Dzarnoski, Jr. et al. | 437/51 |
| 5,006,073 | 4/1991 | Mennona, Jr. | 439/77 |
| 5,025,306 | 6/1991 | Johnson et al. | 357/75 |
| 5,053,646 | 10/1991 | Higuchi et al. | 326/40 |
| 5,089,880 | 2/1992 | Meyer et al. . | |
| 5,105,388 | 4/1992 | Itano et al. | 326/44 |
| 5,110,298 | 5/1992 | Dorinski et al. | 439/65 |
| 5,116,462 | 5/1992 | Bartha et al. | 156/643 |
| 5,130,276 | 7/1992 | Adams et al. | 437/225 |
| 5,196,722 | 3/1993 | Bergendahl et al. | 257/304 |
| 5,202,754 | 4/1993 | Bertin et al. | 257/684 |
| 5,315,178 | 5/1994 | Snider | 326/39 |
| 5,352,940 | 10/1994 | Watson | 326/39 |

OTHER PUBLICATIONS

Anacker et al. "Fabrication of Multiple Miniature Electrical Connector", IBM Technical Disclosure Bulletin, vol. 19, No. 1, Jun. 1976, 1 page.

Henle, R. A., "Vertical Chip Packaging", IBM Technical Disclosure Bulletin, vol. 20, No. 11A, Apr. 1978, p. 4339.

RAM PACK 32, Irvine Sensors Corp., Costa Mesa, CA, brochure, 1 page.

Chang, H. "Bubble Domain Three Dimensional Magneto-Optic Memory", IBM Technical Disclosure Bulletin, vol. 14, No. 9, Feb. 1972, p. 2561.

Johnson, A.H., "Edge-Connected Chip Carrier", IBM Technical Disclosure Bulletin, vol. 21, No. 7, Dec. 1978, p. 2763.

(List continued on next page.)

*Primary Examiner*—Jon Santamauro
*Attorney, Agent, or Firm*—Heslin & Rothenberg, P.C.; Wayne F. Reinke, Esq.

[57] ABSTRACT

A programmable logic array (PLA) includes two direct-write EEPROM arrays, and PLA logic circuitry, such as feedback, drivers and input and output circuitry. One EEPROM array acts as an AND array and the other acts as n OR array. The PLA can be used for a memory function or a PLA function. In one aspect, the EEPROM arrays are placed on a first chip and the PLA logic circuitry a second chip. The first and second chips are stacked face-to-face, and force-responsive self-interlocking microconnectors are used to physically and electrically connect the separate chips. The separate chips are fabricated concurrently to reduce turn-around time.

42 Claims, 20 Drawing Sheets

OTHER PUBLICATIONS

Suer M., "Pursuing 3–D Packages", Electronic Engineering Times, Jan. 21, 1991, p. 66.

Val et al. "3–D Interconnection for Utra–Dense Multi–chip Packages", IEEE International Solid–State Circuits Conference, 1990, pp. 56–57.

Fleisher, H. E et al. "an Introduction to Array Logic", IBM Journal of Research and Development, vol. 19, No. 2, Mar. 1975.

McConnell et al., "An Experimental 4 Mb Flash EEPROM with Sector Erase", IEEE Journal of Solid State Circuits, vol. 26, No. 4, Apr. 1991, pp. 484–491.

Kuriyama et al., "A 5V Only 0.6 µm Flash EEPROM with Row Decoder Scheme in Triple–Well Structure", IEEE International Solid State Circuits Conference, 1992, pp. 152–153.

Little, M.J. et al. "The 3–D Computer" (Hughes Research Lab), J. VLSI Sig. Proc. 2, 79 (1990), one page.

Higuchi et al., "an 85ns 16Mb CMOS EEPROM with Alterable Word Organization", IEEE International Solid–State Circuits Conference, 1990, pp. 56–57.

Münchmeyer, D. and Langen, J., "Manufacture of three–dimensional microdevices using synchrotron radiation (invited)", Rev. Sci. Instrum., 63 (1), Jan. 1992, pp. 713–721.

Reed et al., "Silicon Micro–Velcro", Advanced Materials, 4, No. 1, 1992, pp. 48–52.

Han et al, "Micromechanical Velcro", Journal of Microelectromechanical Systems, vol. 1, No. 1, Mar. 1992, 7 pages.

MULTIPLE CONTACT

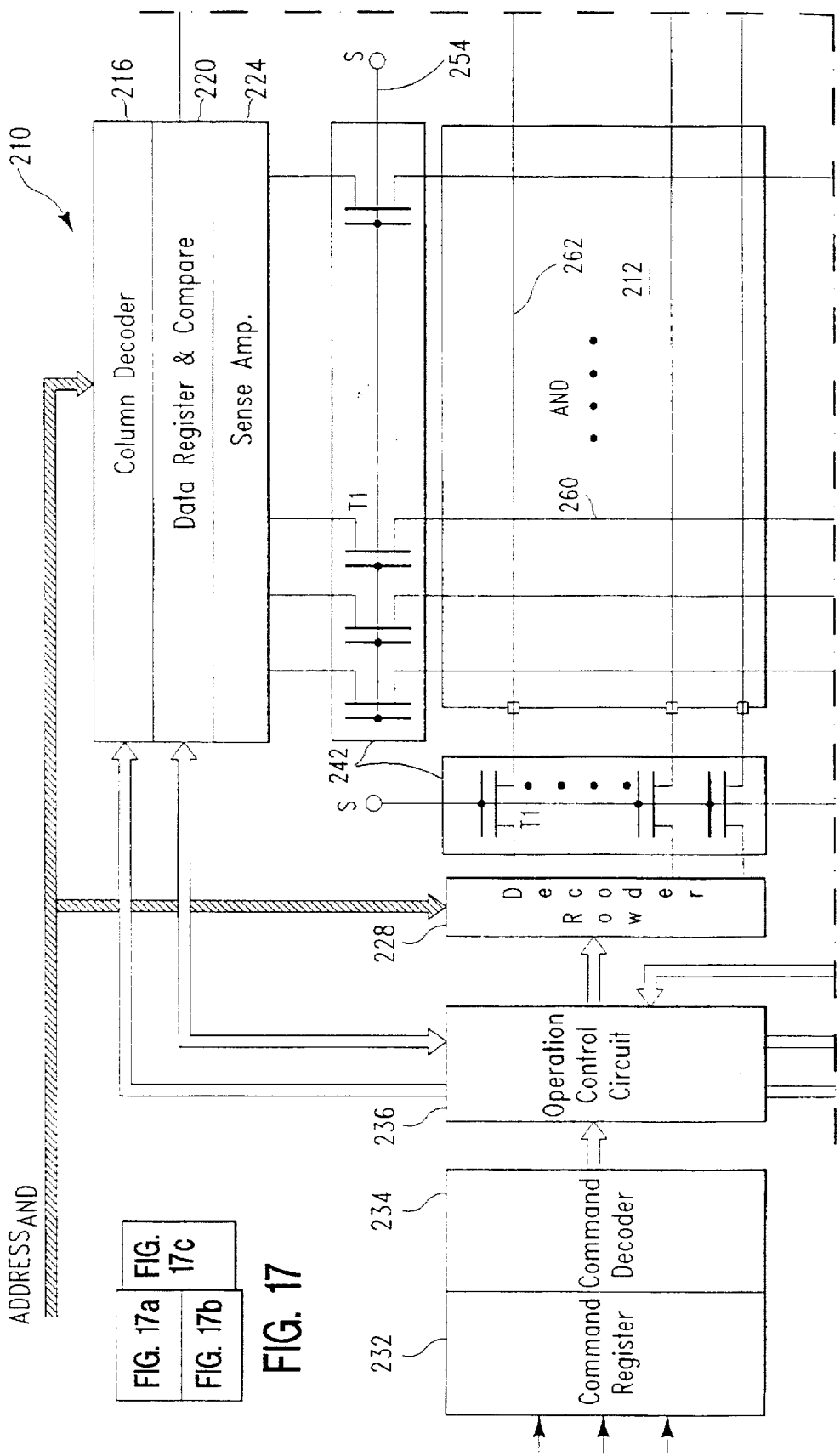

PROGRAMMABLE LOGIC ARRAY

CROSS-REFERENCE TO RELATED APPLICATION

This application contains subject matter which is related to the subject matter of the following applications which are assigned to the same assignee as this application, all of which are being filed concurrently herewith:

"Chip Function Separation Onto Separate Stacked Chips," by C. Bertin et al., Ser. No. 08/560,222 (Docket No. BU9-94-032), filed Nov. 21, 1995; and "Microconnectors" by C. Bertin et al., Ser. No. 560,255 (Docket No. BU9-94-110), filed Nov. 21, 1995.

BACKGROUND OF THE INVENTION

1. Technical Field

The present invention generally relates to programmable logic arrays. More particularly, the present invention relates to a programmable logic array made from a memory array.

2. Background Information

Rapid turn-around time (i.e., the time it takes to manufacture something) for logic generation has become vital to achieving a rapid time to market for new logic products. However, commonly accepted penalties to achieve a rapid turn-around time for programmable arrays, interconnects or combinations of programmable arrays and bus interconnects include lower density, slower performance and interconnection inefficiency and delays. Such is the case with programmable logic arrays (PLAs). In addition, there is constant pressure to density semiconductor chips in general, and in particular PLAs.

Thus, a need exists for a way to decrease the turnaround time for PLAs, and also to density the array.

SUMMARY OF THE INVENTION

Briefly, the present invention satisfies the need for a way to decrease the turn-around time of PLAs, as well as densifying them, by incorporation of an Electrically Erasable Programmable Read Only Memory (EEPROM) and, in one aspect, separating the PLA logic circuitry and EEPROM memory onto separate stacked chips.

In accordance with the above, it is an object of the present invention to provide a faster turn-around time for programmable logic arrays.

It is another object of the present invention to provide a way to density a programmable logic array.

The present invention provides, in a first aspect, a programmable logic array (PLA), comprising a plurality of memory cells and PLA logic circuitry coupled to at least some of the memory cells, the PLA logic circuitry comprising a plurality of inputs, a plurality of outputs and a feedback connection between at least one of the outputs and at least one of the inputs. The PLA may further comprise mode selection circuitry permitting memory function operation apart from the PLA function. The plurality of memory cells may comprise a plurality of EEPROM cells, which may be direct-write EEPROM cells, and memory specific circuits such as sense amplifiers, drivers, decoders, control and input/output circuits. The plurality of inputs may comprise a plurality of bit partitioning circuits. The plurality of PLA outputs may comprise output logic. The plurality of PLA outputs may also comprise a plurality of output latches. The PLA may further comprise a plurality of drivers for driving the plurality of memory cells. Each of the plurality of memory cells of the PLA may comprise a transistor and a flip-flop controlling gate bias on the transistor.

In a second aspect of the present invention, the plurality of memory cells of a PLA according to the first aspect reside on a first semiconductor chip, along with memory specific circuits, and the PLA logic circuitry resides on a second semiconductor chip stackable with the first semiconductor chip, the PLA further comprising a plurality of connectors for connecting the first and second chips. The plurality of connectors may comprise a plurality of force-responsive self-interlocking microconnectors disposed on each of the chips. The plurality of force-responsive self-interlocking microconnectors may provide both a physical and an electrical connection between the first and second chips. Where the force-responsive self-interlocking microconnectors are included, the PLA may further comprise a plurality of repelling members disposed on one of the chips, the plurality of repelling members tending to push away a chip coming into contact therewith and the plurality of force-responsive self-interlocking microconnectors tending to pull the chips together, thereby providing a force-counter-force arrangement. The plurality of force-responsive self-interlocking microconnectors may comprise a plurality of sizes providing differing chip alignment accuracy. Each of the chips of the PLA may further comprise at least one channel in which resides at least one of the plurality of connectors. The plurality of connectors of the PLA may alternatively comprise a plurality of metal bumps oppositely disposed on a facing surface of each chip, the PLA further comprising a means for connecting corresponding oppositely disposed metal bumps, thereby providing both a physical and an electrical connection. The plurality of metal bumps may comprise a plurality of gold bumps.

The present invention provides, in a third aspect, a method of making a PLA of the first aspect, comprising: providing a first memory array having a plurality of inputs, a plurality of outputs and being arranged in rows and columns, the first memory array acting as an AND array and the plurality of columns acting as product term lines; providing a second memory array similar to the first memory array, acting as an OR array; programming the first and second memory arrays; electrically coupling the columns of the first and second arrays; providing PLA logic circuitry having a plurality of inputs and a plurality of outputs; electrically coupling at least one of the PLA logic circuitry outputs with at least one of the PLA logic circuitry inputs, thereby providing at least one feedback connection; electrically coupling at least some of the inputs of the first memory array with at least some of the inputs of the PLA logic array circuitry; and electrically coupling at least some of the outputs of the second memory array with at least some of the outputs of the PLA logic circuitry. The first and second memory arrays may each comprise an EEPROM memory array, the step of programming comprising programming the first and second EEPROM memory arrays. The feedback connection may be made through feedback circuitry. The inputs and outputs of the memory arrays may be coupled to the inputs and outputs of the PLA logic circuitry through a plurality of pass gates.

The present invention provides, in a fourth aspect, a method of making a PLA of the second aspect, comprising the steps of the third aspect together with steps of: forming a plurality of connectors for connecting the first and second semiconductor chips; and stacking the chips together. The memory arrays may be provided, the programming thereof and coupling of the columns accomplished concurrently with providing the PLA logic circuitry and the feedback connection, since these activities are done on separate chips. The step of forming connectors may comprise forming a plurality of force-responsive self-interlocking microconnectors disposed on each of the chips, wherein the microconnectors may provide both a physical and an electrical connection between the chips. The step of stacking may comprise pressing the chips together such that the plurality of force-responsive self-interlocking microconnectors interlock. Where the microconnectors are included, the method may further comprise forming at least one channel on each of the chips on which to form at least one of the microconnectors. The step of forming a plurality of connectors may alternatively comprise forming a plurality of metal bumps oppositely disposed on the chips. Where a plurality of metal bumps are included, the step of stacking may comprise providing a means for physically and electrically connecting the plurality of oppositely disposed metal bumps. The PLA logic circuitry may reside on a face of the second semiconductor chip, the first and second memory arrays may reside on a face of the first semiconductor chip, and the step of stacking may comprise stacking the first and second semiconductor chips face-to-face.

These, and other objects, features and advantages of this invention will become apparent from the following detailed description of the various aspects of the invention taken in conjunction with the accompanying drawings.

BRIEF DESCRIPTION OF THE DRAWINGS

FIG. I depicts a conventional PLA in MOSFET technology showing the distinct AND array and OR array.

FIG. 17 and FIGS. 17a–17c depict a memory and programmable logic array on a single semiconductor chip, in accordance with the present invention.

BEST MODE FOR CARRYING OUT THE INVENTION

Figure 1:
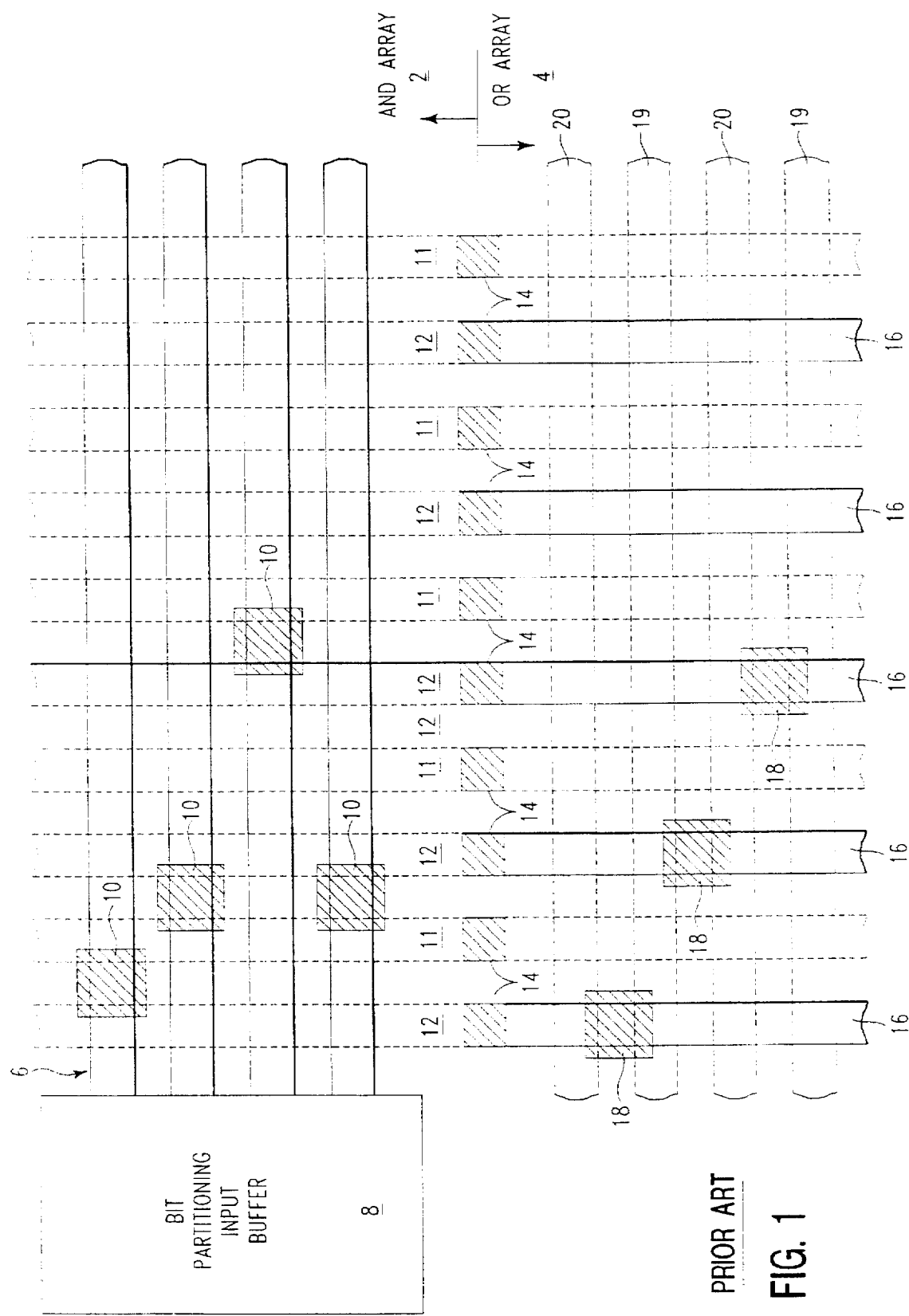

The advantages of and approaches to the design of PLAs are discussed in detail by Fleisher and Maissel (H. Fleisher and L. I. Maissel, "An Introduction to Array Logic," IBM Journal of Research and Development, Vol. 19, No. 2, Mar., 1975). Fleisher and Maissel cover the key elements of a PLA, such as the AND and OR arrays, the bit partitioning circuit (referred to as the decode), the inputs, outputs and feedback loops described in terms of fixed array elements (NMOS FETs, for example). Fleisher and Maissel mention the advantage of having a read/write element in each array location, however, they point out that such an element was not available in 1975. Instead, they discuss adding a small memory element at each array intersection along with a logic gate. They do not describe how such memory elements would be programmed to set the "1" or "0" state at each of the array intersections.

U.S. Pat. No. 4,158,239, issued to Bertin on Jun. 12, 1979 and assigned to IBM, entitled "Resistive Gate FET Flip-Flop Storage Cell," which is herein incorporated by reference in its entirety, describes a variable (or electrically alterable) general purpose PLA element composed of a flip-flop and two series NMOS transistors at each PLA array location. It includes a description of the method of setting the state of each bit by setting the state of the flip-flop, and the operation of the PLA cell. U.S. Pat. No. 4,177,452, issued to Balasubramanian et al. on Dec. 4, 1979, and assigned to IBM, entitled, "Electrically Programmable Logic Array," describes one application of the alterable PLA flip-flop controlled cell described in U.S. Pat. No. 4,158,239 which is herein incorporated by reference in its entirety. The addition of transistors in order to introduce different modes of operation for a PLA is discussed in U.S. Pat. No. 4,140,967, issued to Balasubramanian et al. on Feb. 20, 1979 and assigned to IBM, entitled "Merged Array PLA Device, Circuit, Fabrication Method and Testing Technique," which is herein incorporated by reference in its entirety, as well as in U.S. Pat. No. 4,212,026, issued to Balasubramanian et al. and assigned to IBM, entitled "Merged Array PLA Device, Circuit, Fabrication Method and Testing Technique," a division of U.S. Pat. No. 4,140,967 and which is also herein incorporated by reference in its entirety. In both U.S. Pat. No. 4,140,967 and 4,212,026, the transistors are used to set the PLA into a test mode or a normal logic operating mode.

The advent of EEPROM devices makes it possible to store a "1" or "0" state at each PLA intersection in a single readable/writable device. This is made possible by the addition of a floating gate between the NMOS control gate and the channel. After initial fabrication, the floating gate is uncharged and the threshold voltage is low, normally the conducting state. Programming the device consists of injecting electrons into the floating gate until the threshold voltage increase to a value above the power supply voltage such that the device is never in the conducting state. This results in a much denser alterable PLA array than those which use flip-flops at each array location. Also, the device is non-volatile because the electrons on the floating gate are retained even after the power supply has been removed.

Unlike the setting of the flip-flop memory states in a single operating cycle, EEPROM devices often take multiple cycles, with test verification between cycles to ensure sufficient threshold voltage shifting has occurred. Each time the state of the array cells is to be changed, the entire programming/verification cycle must be repeated using special programming/verification circuits associated with EEPROM memory devices. The PLA operation occurs after each bit location has been programmed to the correct state (i.e., programmed to a "1" or a "0"). Using additional transistors as described in U.S. Pat. Nos. 4,140,967 and 4,212,026, the EEPROM array bits can be common between an EEPROM memory function and a PLA logic function, resulting in very rapid TAT (reprogramming of the logic function in microseconds or milliseconds), as well as some degree of array densification. However, TAT can be longer and traded off for greater array density.

FIG. 1 illustrates a conventional implementation of a programmable logic array (PLA) in MOSFET technology where the distinct AND array 2 and OR array 4 are shown. Inputs 6 to the AND array 2 from the input bit partitioning circuit 8 are on the metal level devices 10 in the AND array 2 which is made active by growing a thin-oxide region between ground diffusions 11 and product term diffusions 12. Signal outputs from the AND array 2 are transmitted through diffused product array lines 12. As these product terms enter the OR array 4, they are transformed to the metal level 16 through contacts 14 as shown. The OR array devices 18 are active if a thin-oxide region is grown between ground diffusions 19 and output diffusions 20. Outputs from the OR array are on diffused lines 20. Note that array lines 6 and 16 could be made of polysilicon, as well as gates 10 and 18, and metal contacts to diffusion could be used for lines 11, 12, 19 and 20.

The mask-programmable approach for creating the PLA of FIG. 1 has a slow turn-around time (TAT), due to the numerous process steps following the gate personalization step, accomplished by the presence or absence of a gate at every array location. Alternatively, personalizing at the metal mask level provides a faster TAT, but sacrifices considerable density. The present invention describes a PLA and method of making same which densifies the array and decreases TAT by including EEPROM technology.

Figure 2:
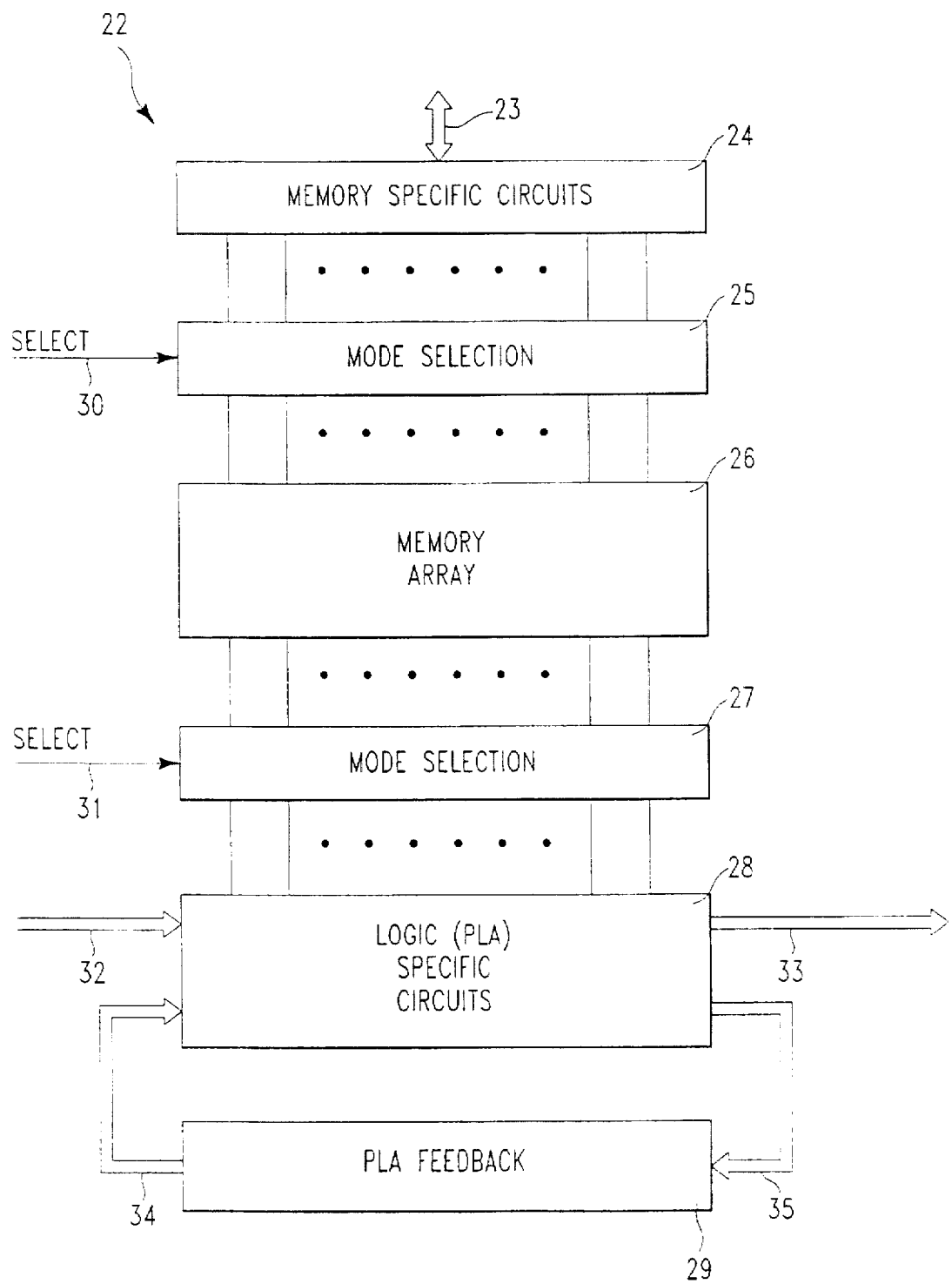
FIG. 2 is a simplified conceptual block diagram of a programmable logic array of the present invention.

FIG. 2 is a simplified conceptual block diagram 22 of the present invention. Block diagram 22 comprises memory external input/output connections 23, memory specific circuits 24, mode selection circuit 25, EEPROM array 26, mode selection circuit 27, logic (PLA) specific circuits 28 and PLA feedback circuit 29. Mode selection circuit 25 has a select input 30, and mode selection circuit 27 has a mode select input 31. Logic (PLA) specific circuits 28 has an external input 32 and an external output 33. Feedback lines 35 extend from PLA circuits 28 to PLA feedback circuit 29. Feedback lines 34 extend from PLA feedback circuit 29 to PLA circuit 28. Mode selection circuits (not shown in FIG. 2, but shown in FIG. 17) can be used in the memory array region.

Figure 17B:
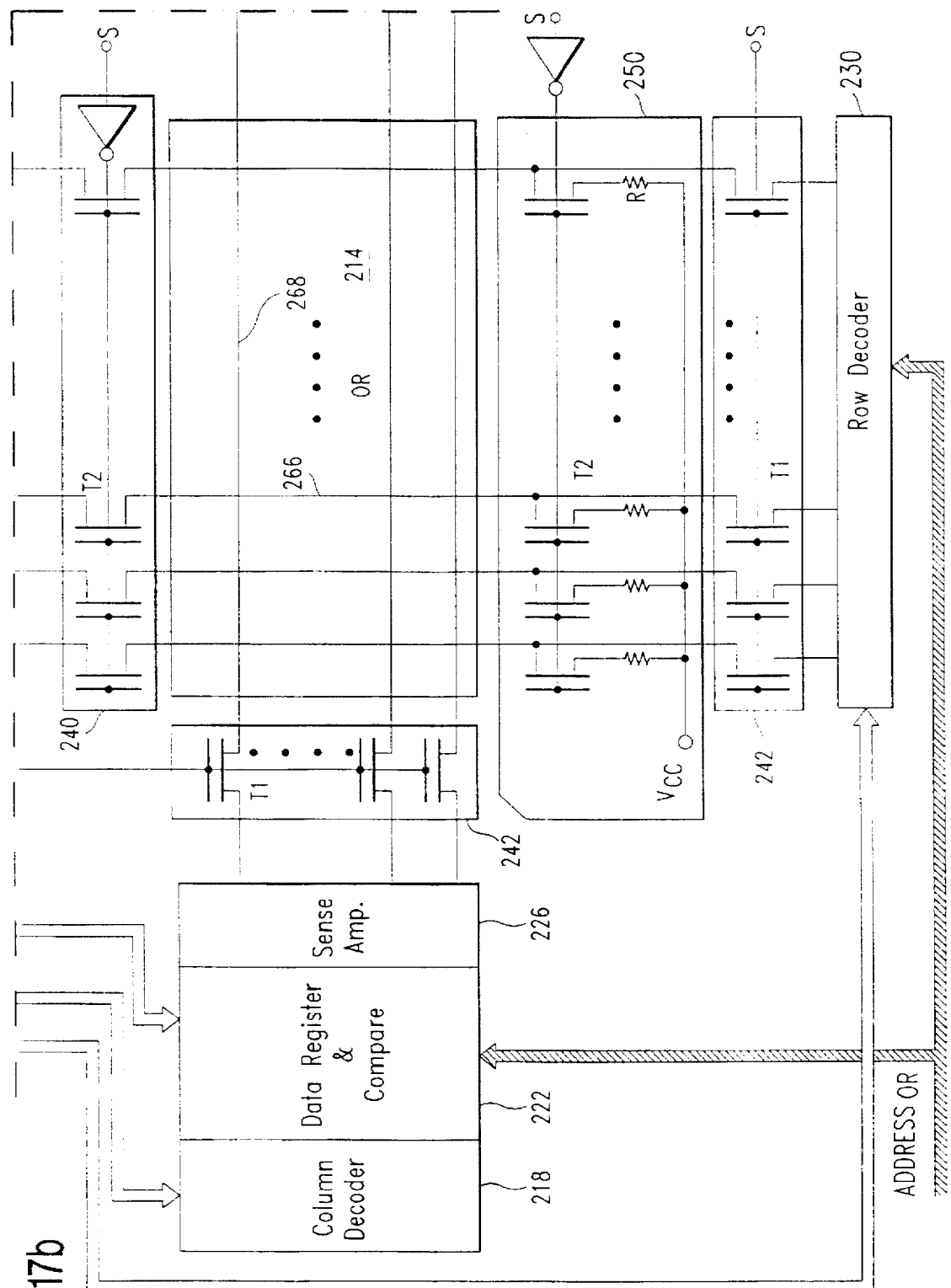
Figure 17C:
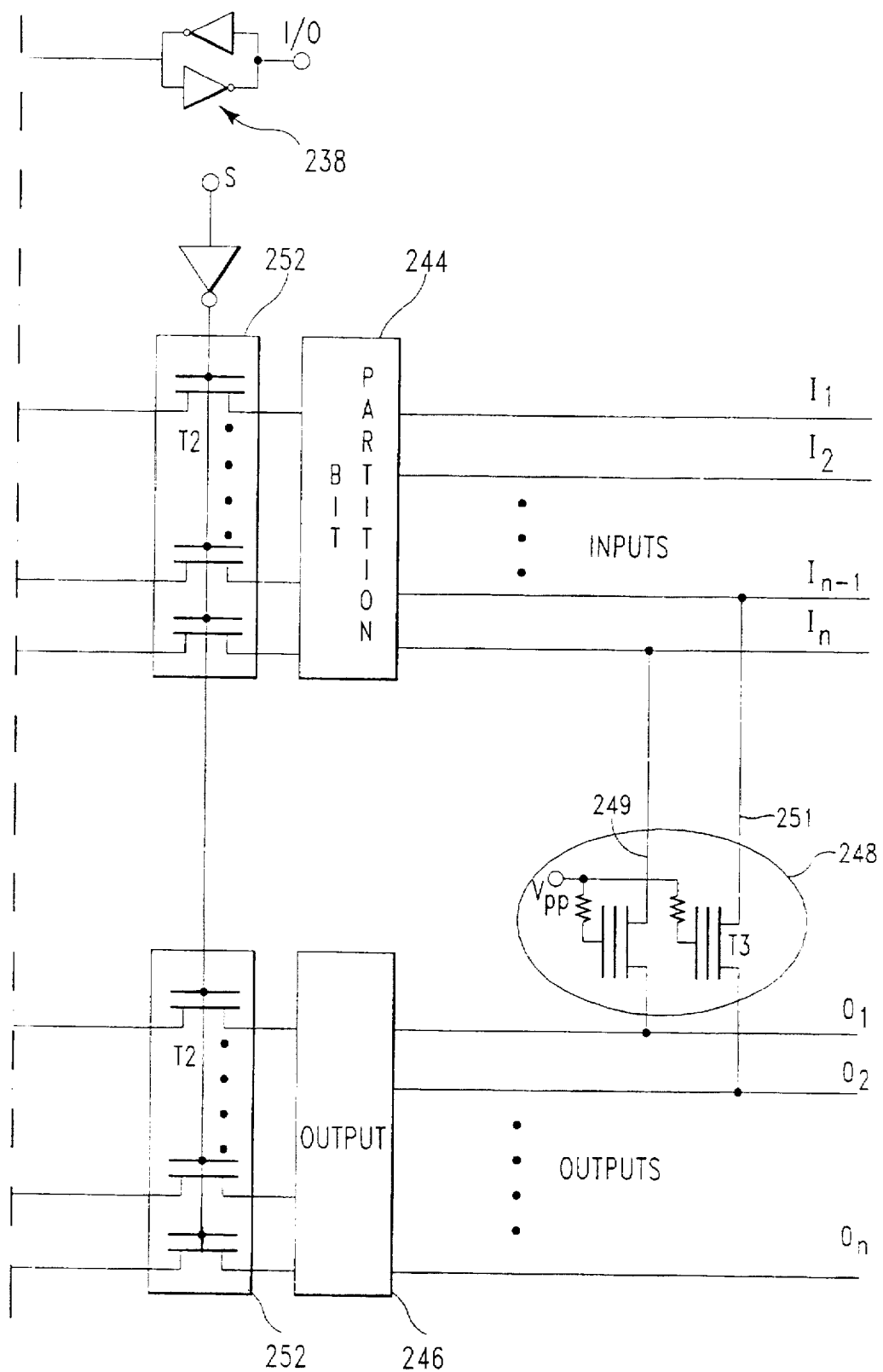

In a first aspect of the present invention, the circuitry of block diagram 22 is placed on a single chip. Mode selection circuits 25 and 27 determine whether the chip will operate as an EEPROM memory or as a PLA. If the select inputs 30 and 31 to mode selection circuits 25 and 27 are a high voltage, typically near the power supply voltage, the chip will operate as an EEPROM memory. If the select input is a low voltage, near ground, then the chip will operate as a PLA. Further details regarding the circuitry of block diagram 22 on a single chip is shown in FIG. 17, which will be discussed subsequently.

In a second aspect of the present invention, the EEPROM array 26 and memory specific circuits 24 are placed on a first semiconductor chip, with EEPROM arrays as a base, laid out to facilitate incorporation into a PLA logic function. Connect and disconnect regions are provided for mode selection to assist in formation of the PLA logic function with a second chip. The connect and disconnect regions are shown as physical connections (see FIGS. 5, 6 and 7), however, they may be formed electrically using a combination of well-known fuse blow (resistance increase) and anti-fuse (resistance decrease) techniques (see K. Kato, T. Ono, Y. Amemiya, "A Physical Mechanism of Current-Induced Resistance Decrease in Heavily Doped Polysilicon Resistors," IEEE Transactions on Electronic Devices, Vol. ED-29, No. 8, August 1982) and corresponding control circuitry, pass gates controlled by EEPROM devices, etc. The remaining circuits, feedback connections, etc. are placed on a second semiconductor chip to optimize the combination of size and turn-around time. By separating the logic and feedback functions, the semiconductor chips can be separately processed, therefore reducing the turn-around time. The two semiconductor chips are then stacked and connected using a dense contact scheme and share the same EEPROM array devices (see FIG. 8).

Each bit location in the EEPROM array is a dense direct-write or erase/program EEPROM cell. The array is non-volatile, but write (i.e., programming) time is slow, typically microseconds or milliseconds, and read is relatively fast (nanoseconds). If the EEPROM array pattern of 1's and 0's is seldom modified, this density/performance tradeoff is desirable. The bit locations define the logic function of the PLA. Address locations can be reserved to store initialization patterns when power is first applied to the PLA. Alternatively, the certain designated address locations can point to information in another device including the starting address. Still another possibility is to have the last state of the PLA (when power was turned off) be the starting point when power is restored. For applications where it is necessary to frequently alter the array bit configuration (i.e., "1" and "0" values of the array cell locations) and write times comparable to read times are desirable, each EEPROM array cell can be replaced by a flip-flop with a logic gate, as described in U.S. Pat. No. 4,158,239, discussed above. The flip-flop storage is volatile and needs to be initialized using non-volatile EEPROM initialization bits on the chip or by an off-chip device. Further information regarding general PLA operation can be found in the Fleisher and Maissel article discussed above.

It will be understood that the logic function of FIG. 2 may be implemented using any EEPROM technology as a base. In general, EEPROMs may be of the read/erase/write type, or the read/write (direct write) type. The description given herein involves direct-write EEPROM technology, however, any EEPROM technology could be used.

Figure 3A:
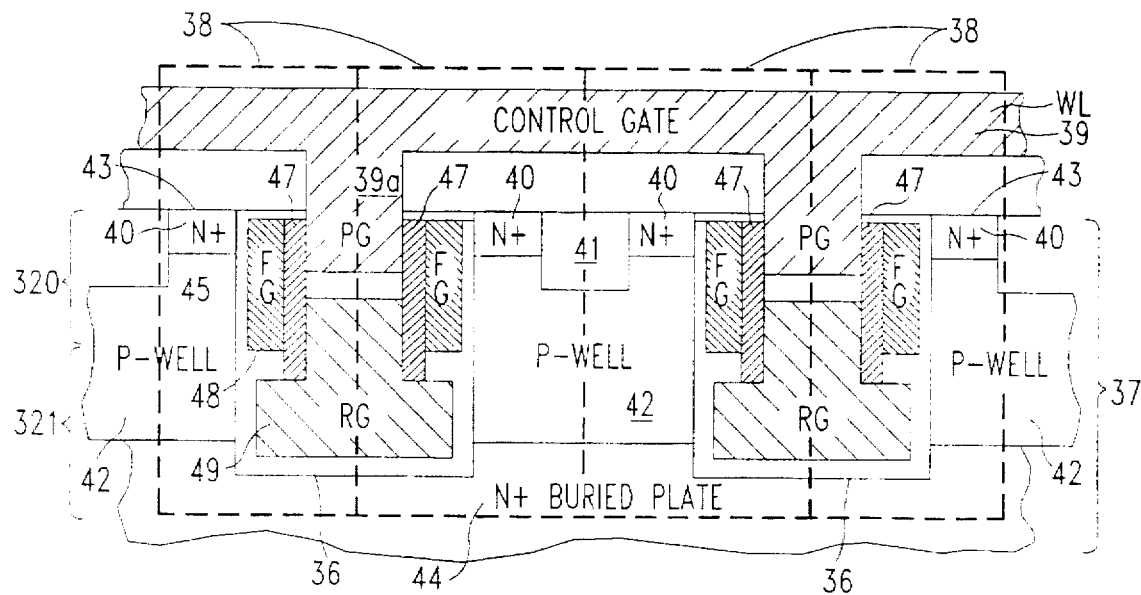
FIGS. 3a and 3b depict a partial cross-sectional view and corresponding partial plan view of one embodiment of a three-dimensional direct-write EEPROM array useful with the present invention.
Figure 3B:
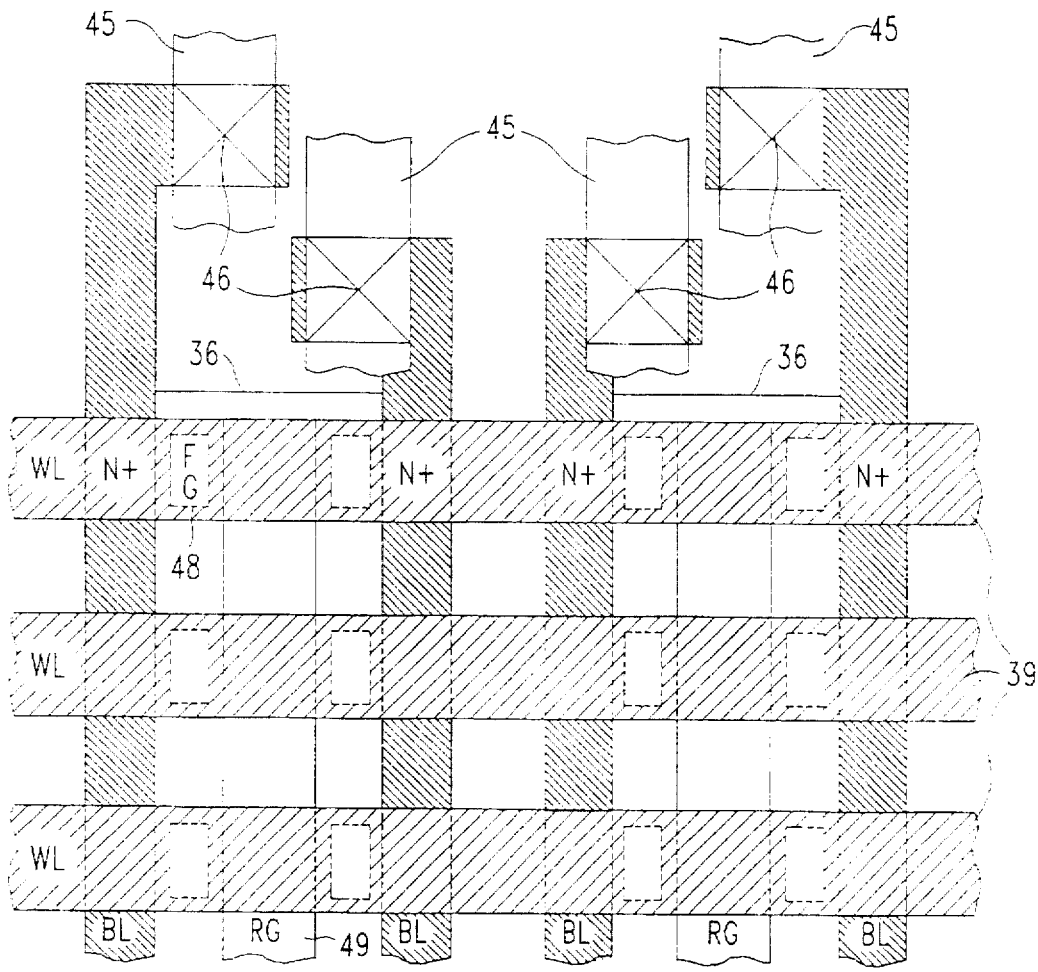

FIGS. 3a and 3b depict a partial cross-sectional view and corresponding partial plan view of one embodiment of a three-dimensional direct-write EEPROM array useful in the EEPROM array 26 of FIG. 2. Employed are a plurality of shallow trenches 36 in a substrate material 37. Each trench is sized and configured to accommodate at least one three-dimensional (i.e., vertically constructed) direct-write EEPROM memory cell 38. Several memory cells 38 are outlined in phantom in the cross-sectional view of FIG. 3a.

Continuous recall gate (RG) 49 is disposed in a bottom portion of each shallow trench 36. Discrete floating gates (FG) 48 are provided along a first sidewall portion and a second sidewall portion of each of the trenches as shown. Preferably, a plurality of floating gate (FG) structures are defined along the length of each sidewall of the elongated, substantially parallel trenches (see FIG. 3b). Each floating gate structure defines an EEPROM memory cell 38 in combination with the surrounding substrate 37, the continuous recall gate (RG) and an associated program gate (PG). The program gates (PG) 39a, which are provided in an upper portion of each of the trenches, are each associated with a pair of floating gates FG) (i.e., a first floating gate along a first sidewall portion of each trench and a second floating gate along a second sidewall portion thereof). The program gates are coupled together via a control gate or wordline (WL) 39 (see FIG. 3b), which run orthogonal to the elongated trenches.

N+ diffusion regions 40 are divided by oxide isolation 41, producing two narrow diffusions in the substrate between adjacent elongated cells 38. Each separate, isolated diffusion 40 is dedicated to a particular EEPROM memory cell 38 within the array. Diffusions 40 comprise shared sources (or drains) which define bitlines (BL) to be used in combination with the wordlines (WL) interconnecting the program gates to select individual EEPROM memory cells. Diffusions 40 reside within a P-well 42 initially formed in substrate 37 from surface 43. Preferably, P-well 42 extends to contact an N+ buried plate 44 in the substrate. Bitline straps 45 are connected at various locations 46 to each diffusion 40. Those skilled in the art will recognize that the various conductivity types (P,N) provided with the example herein set forth could be uniformly exchanged in a circuit array.

In addition to the vertical disposition of multiple EEPROM memory cells in parallel formed trenches in the semiconductor substrate, each direct-write EEPROM cell is preferably fabricated to contain a silicon-rich dielectric (e.g., silicon-rich nitride or silicon-rich oxide) as the insulative material 47 between adjacent surfaces of the recall gate (RG) and the associated floating gates (FG), and correspondingly between each floating gate (FG) in a trench and its respective program gate (PG). The silicon-rich dielectric allows Fowler-Nordheim electron tunneling effects between the various recall gates and their associated floating gates and, correspondingly, between the various floating gates and their associated program gates. Therefore, the voltage necessary to transfer electrons onto and from the floating gates is advantageously minimized.

In a direct-write EEPROM memory array structure such as that depicted, the shallow trenches 36 are spaced as close together as possible. Also, the recall gates (RG) function during a read cycle, and as a vertical channel-inhibit gate. Each recall gate (RG) runs inside and parallel to each trench as shown in FIGS. 3a and 3b. The tunneling mechanism of electrons according to Fowler-Nordheim takes place between the recall gate (RG) and an associated floating gate (FG), also between the program gate (PG) and an associated floating gate (FG), and is controlled by the voltage difference therebetween. The voltage difference is determined by the capacitance ratio as between these gate structures The absence or presence of diffusion capacitance in the P-well substrate in series with gate oxide (dielectric) 47 modulates the capacitance value and therefore the voltage difference between these polygates via modulation of the cell coupling ratio. The N+ diffusions are even with the trench walls and are common to many EEPROM devices (see FIG. 3b), which is to enhance array density. Bitline connections are made as shown in FIG. 3b. Each trench utilizes a single wordline for two paired floating gates of the EEPROM memory array. N+ diffusions 40 on either side of each trench must go to different contact points.

Although discussed above, the recall gate (RG) inhibit function is not necessary, however, it could be used to block rewrite selected bits in a byte as a product feature. In addition, the bitline strapping can become a pitch limiter in the direction perpendicular to the trenches (i.e., unless two strap layers 45 are used to contact the two isolated diffusions between adjacent parallel trenches, as shown in FIG. 3b). A more in-depth description of the exemplary EEPROM array can be found in a pending U.S. Patent Application entitled "Three-Dimensional Direct-Write EEPROM Arrays and Fabrication Methods," by Bertin et al. and assigned to IBM, filed Mar. 12, 1992, Ser. No. 07/850,734, now U.S. Pat. No. 5,467,305 which is herein incorporated by reference in its entirety. A more in-depth description of the EEPROM cell inside a trench can also be found in U.S. Pat. No. 5,196.722 issued to Bergendahl et al. Mar. 23, 1993 and assigned to IBM, entitled "Shadow RAM Cell Having a Shallow Trench EEPROM", which is herein incorporated by reference in its entirety.

Figure 4:
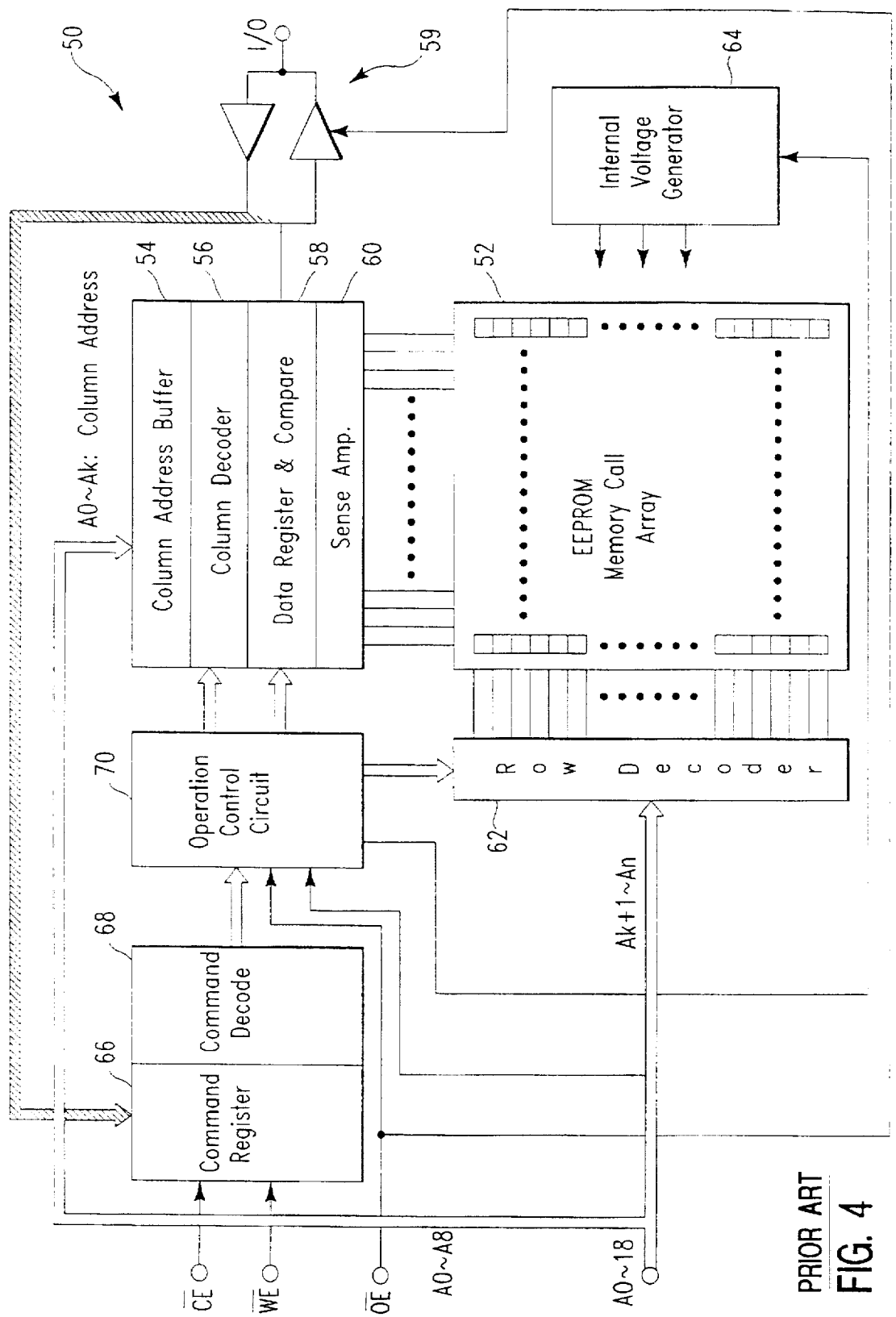
FIG. 4 is a block diagram of circuitry for a conventional EEPROM memory function.

FIG. 4 is a block diagram of circuitry for a conventional EEPROM memory 50, comprising EEPROM memory cell array 52, column address buffer 54, column decoder 56, data register and compare circuitry 58, I/O circuitry 59, sense amplifier 60, row decoder 62, internal voltage generator 64, command register 66, command decoder 68, and operational control circuit 70. EEPROM memory 50 includes a feedback arrangement which alters the threshold voltage of array devices in incremental steps. The threshold voltage is shifted by putting carriers onto a floating gate. The basic difference between an EEPROM memory cell and a memory cell of other known technologies, such as DRAM or SRAM, is that verification of a write is necessary in an EEPROM memory cell, but not the other technologies. Since the floating gate is between the control gate and the channel, the floating gate effectively prevents the typical 3-to-5 volts applied to the control gate of a non-EEPROM memory cell from altering the channel region to be the same N or P type as the source and drain if the device has been programmed (i.e., electrons on the floating gate). Thus, with EEPROM technology, a device threshold voltage shift is needed (typically greater than Vcc) to alter the state of a programmed device. However, even with the higher programming voltage, a single attempt or even several attempts may not be enough, which is why verification of the write is necessary. A key advantage of EEPROM technology over other electronic memory cell technology is that it is non-volatile. Conventional processing techniques (masking, etc.) can be used to construct a permanent hardware logic function, however, the logic function cannot be changed and the turn-around time for such hardware may be unacceptable for many applications.

FIG. 17 depicts a modified EEPROM memory 210, showing how a conventional EEPROM array, such as that shown in FIG. 4, is modified for PLA personalization according to the first aspect of the invention. Modified EEPROM memory 210 comprises AND array 212, OR array 214, column decoders 216 and 218, data register and compare circuitry 220 and 222, sense amplifiers 224 and 226, row decoders 228 and 230, command register 232, command decoder 234, operational control circuit 236 and EEPROM memory I/O 238. Note that AND array 212 and OR array 214 are connected to each other only when pass gates 240 are active. Also note that the column decoder, data register and compare circuitry, and sense amplifier have been repeated for both AND array 212 and OR array 214. The arrays are positioned so that the AND array product term lines 260 and OR array product term lines 266 can be electrically connected by pass gates 240. Lines 260 may also act as the bit lines of memory subarray 212. Lines 266 may also act as the word lines of memory subarray 214. Command register 232, command decoder 234 and operational control circuit 236 have been modified for the two separate arrays, rather than a single array. Pass gates 242 will be electronically disconnected after programming, verification and testing of the separate arrays is complete. It will be understood that EEPROM control, decode, sense, I/O, etc. will not be powered when operating in the PLA mode. Modified EEPROM memory 210 further comprises bit partitioning circuit 244, output circuit 246, feedback circuitry 248, product term drivers 250 and pass gates 252. The transistors shown in FIG. 17 are MOSFET devices. Bit partitioning circuit 244 is a conventional NAND array function well known in the art, and electrically connected to bit partitioning lines 262 and AND array 212. Output circuit 246 could be, for example, output latches and/or exclusive-or gates or other logic at the output of OR array 214, and electrically connected to output lines 268 of OR array 214. Lines 262 also function as word lines of memory subarray 212. Lines 268 also function as bit lines of memory subarray 214. Product term drivers 250 drive the product term lines 266 of OR array 214, and through pass gates 240, also drive the product term lines 260 of AND array 214. In their simplest form, product term drivers 250 may be, as shown in FIG. 17, resistors tied to power supplies. Two feedback lines 249 and 251, and feedback circuitry 248, are exemplary, the particular number and placement of feedback lines being determined by the logic functions to be performed, and provide the custom PLA output to input feedback required to realize the PLA function. Output circuitry 246 also provides the ability to store the state of the output of OR array 214. In addition, at some of the outputs (or inputs), there may be what is known as "dotting", which is an input or an output being tied to both an external input or output, respectively, as well as being used for feedback. Special circuitry is required to allow dotting, since one needs to make sure that the data line, which has two different paths, is not sending data on both paths simultaneously. An example of such circuitry would be the use of tri-state circuitry, which one skilled in the art will understand. For each feedback line, feedback circuitry 248 comprises a transistor and a register tied to a voltage Vpp, a programming voltage, usually higher than VCC. A select input, such as select input 254, to all the pass gates and product term drivers determines whether modified EEPROM memory 210 functions as a memory or a PLA. Specifically, when the select input is high, pass gates 242 are active, and array 210 operates as an EEPROM memory array. When the select input is low, only pass gates 240, pass gates 252 and product term drivers 250 are active, allowing operation as a PLA. In this manner, the select input operates as a mode select. The invention has been described in terms of the EEPROM array bits, shared by the EEPROM circuits and the PLA circuits, as programmed by the EEPROM memory function. However, the PLA circuits can also be used to program (change the EEPROM array bit state) if desired.

An alternate embodiment of the combined memory and logic array shown in FIG. 17 will be described. In situations where the alteration of EEPROM array bit states ("1" or "0") is required frequently or at high speed, the hundreds of microseconds to several milliseconds required to alter the logic state of an EEPROM array is unacceptable. Instead, array density could be sacrificed to substitute flip-flop storage at every AND and OR array location. On the memory side of FIG. 17, SRAM peripheral circuits are used. These are similar to EEPROM decode and sense circuits, except that there is no need for special high programming voltage and no need for multiple write pulses to the array as is the case for EEPROM storage. The PLA circuits and architecture remains the same as shown in FIG. 17.

The new array cell used in the AND and OR array is described in U.S. Pat. No. 4,158,239. The new AND array cell of array 212 has two transistors in series. The gate of the first transistor is connected to the bit partitioning line and one diffusion is connected, through a via hole, to the product term line. The other diffusion of the first transistor is tied to the diffusion of the second transistor. The gate of the second transistor is controlled by the flip-flop which contains the logic state, "1" or "0", of the AND array cell. The other diffusion of the second transistor goes to ground. The flip-flop of U.S. Pat. No. 4,158,239 is an NMOS flip-flop with 5 devices, with a single, independent input/output line for read and write operations. The five transistor single input cell was chosen because of flip-flip flop density. A six transistor flip-flop with two input/output lines can be used for faster operation but with a larger storage cell. The NMOS flip-flop was state of the art at the time of the patent. A CMOS flip-flop could be used instead for lower power dissipation and better noise margins. An example of a CMOS SRAM storage cell is given in H. B. Bakoglu, "Circuits, Interconnections, and Packaging for VLSI," Addison-Wesley Publishing Company, 1990, page 144, FIG. 4.7a. The CMOS flip-flop shown has 6 devices with separate bit line/bit line complement inputs for higher performance. If the complementary bit line and associated I/O transistor are deleted, the flip-flop is a CMOS 5 transistor flip-flop. Five or six device flip-flops can be used for the storage of the logic state. The flip-flop state sets the state of the AND array cell bit. The flip-flop, and therefore the state of the flip-flop, is controlled by the memory function of FIG. 17. The function of the two series transistors and flip-flop cell in each AND array location of the PLA is described in detail in U.S. Pat. No. 4,158,238.

Similarly, the new OR array cell of array 214 has two transistors in series. The gate of the first transistor is connected to a product term line from the AND array and one diffusion is connected, through a via hole, to an OR array output line. The other diffusion of the first transistor is tied to the diffusion of the second transistor. The gate of the second transistor is controlled by the flip-flop which contains the logic state, "1" or "0", of the OR array cell. The other diffusion of the second transistor goes to ground. The flip-flop has an independent read/write line which sets the state of the OR array bit location. The state is controlled by the memory control function shown in FIG. 17. The function of the two series transistors and flip-flop cell in OR array of a PLA is described in detail in U.S. Pat. No. 4,158,238. The flip-flop could be a five or six transistor CMOS flip-flop as described above.

In summary, the alternate embodiment contains AND array 212 and OR array 214, with each bit location having two series transistors and one flip-flop connected in the manner described in U.S. Pat. No. 4,158,239. The architecture of the combined memory and logic function of FIG. 17 remains unchanged. There is no longer any requirement for high programming voltages and for verification of programming. Circuit modifications to accommodate the new cell will be apparent to those familiar with the art. With flop-flop storage instead of EEPROM storage, the state of the individual bits can be changed in nanoseconds. State of the art SRAM array write times are less than 10 nanoseconds. At these speeds, PLA bit states can be modified at cycle times of 10 nanoseconds. The logic function can be changed as often as every logic cycle if desired to optimize the PLA logic function in real time.

Following are descriptions of several alternative embodiments of FIG. 17.

Figure 18A:
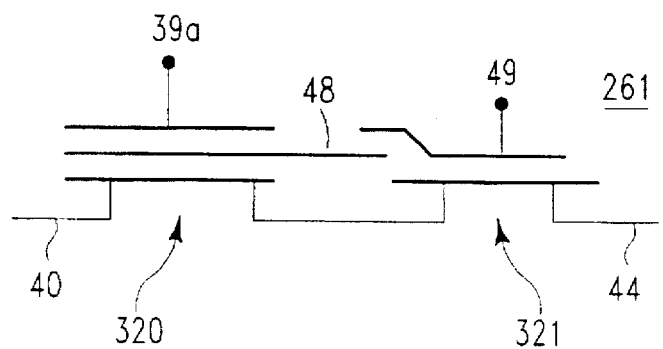
FIG. 18a depicts the equivalent circuit of the EEPROM memory array cell of FIG. 3a and FIG. 3b.

FIG. 18a shows equivalent circuit 261 of the EEPROM structure portion of FIGS. 3a–3b. Transistors 320 and 321 are in series, and both transistors 320 and 321 must be "on", that is have the channel region activated, to form a path between diffusions 40 and 44. Gate 39a is connected to array control gate, or word line, 39 (FIGS. 3a–3b). Floating gate 48 couples to control gate 39a through dielectric 47 designed to facilitate tunneling of electrons between control gate 39a and floating gate 48. Floating gate 48 also couples to the channel region of transistor 320 through gate oxide 47'. The substrate (P-well 42) capacitance, in series with the gate oxide capacitance, will vary in value over a wide range between channel region depletion and inversion.

Diffusion 40 is connected to the array bit lines (BL) of FIGS. 3a–3b. The bit lines can be at ground potential or at the power supply voltage of 5 or 3.3 volts, for example. Node 44 (buried plate diffusion) is usually at ground potential. If gate 49 is at ground potential, device 321 is "off" and a continuous path between diffusions 40 and 44 is not possible. If gate 49 is at a positive potential, then a continuous path can be formed between diffusions 40 and 44 if transistor 320 is "on". The degree of overlap of gate 49 and floating gate 48 is determined by the design of the trench structure 36 of FIG. 3a–3b. The overlap can be designed such that recall gate 49 can inhibit or enhance the programming of the voltage on floating gate 48 when programming gate (or word line) 39a is activated as an additional programming option if desired. Programming or write for this EEPROM cell is direct, that is, it does not require prior erasure of the pre-existing state.

The read operation is performed as follows. Gate 49 is set to a positive voltage, 5 volts for example. Gate 39a is also set at 5 volts. If device 320 is in its low threshold state (no electrons on the floating gate), then a continuous path will be formed between 40 and 44. If device 320 is in a high threshold state (electrons on floating gate 48), then device 320 remains "off" and there is no continuous path between nodes 40 and 44.

The write (or programming) operation is performed as follows. Gate 49 is set to ground preventing connection between transistor 320 and difffusions 40 and 44. Gate 39a is typically pulsed above 10 to 15 volts, creating a potential well with electrons in the channel region of transistor 320. If diffusion 40 is positive, the electrons are swept away, the channel region is depleted, and a substrate capacitance appears in series with the gate oxide capacitor, causing floating gate 48 to be lightly coupled to the substrate (p-well 42). If diffusion 40 is grounded, electrons remain in the channel region and the floating gate is tightly coupled to the substrate potential. This modulation of the capacitance results in electrons attracted to or repelled from the floating gate, thus modulating the threshold voltage of device 320. U.S. Pat. No. 5,196,722, incorporated herein by reference, and patent application Ser. No. 07/850,734, give a more detailed operation of this cell.

As discussed, recall gate 49 is positive during read and grounded during write. When used in arrays 212 or 214 (FIG. 17) recall gate 49 provides an extra terminal, which provides an extra degree of freedom in the operation of the PLA. For example, if a cell of array 21 or 214 is programmed such that transistor 320 (FIG. 18a) is normally on, and it is desired to over ride this state during a phase of PLA operation, then the path to ground diffusion 44 can be blocked and the state of the PLA cell changed at electronic speeds without going through a write or programming cycle. This electronic masking capability is useful because the state of transistor 321 can be changed in nanoseconds, while re-programming transistor 320 can take from 10 to 100 microseconds.

Figure 19:
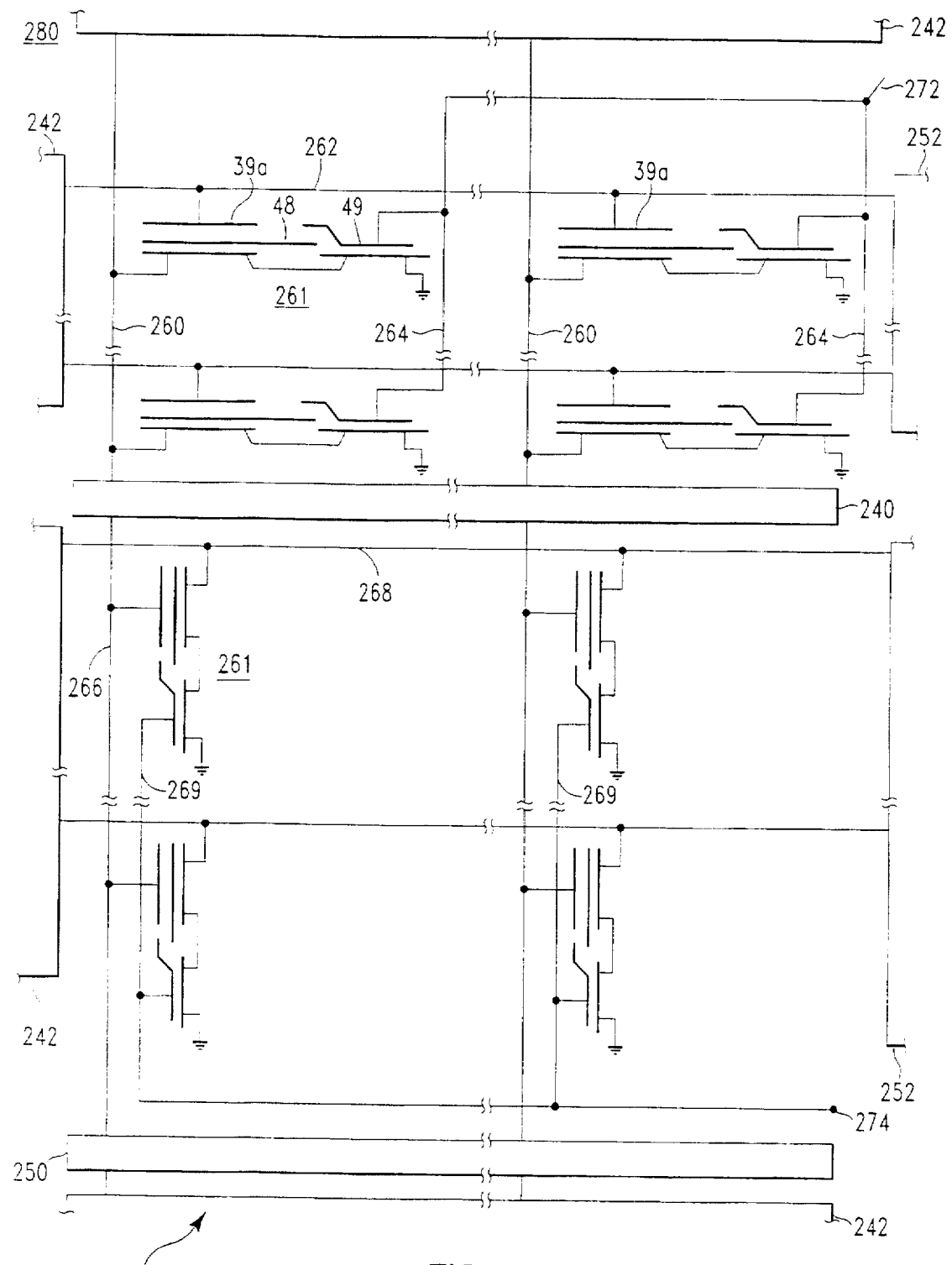
FIG. 19 depicts the EEPROM equivalent circuit of FIG. 18a integrated into the modified EEPROM memory of FIG. 17.

FIG. 19 shows EEPROM cell 261 integrated into modified EEPROM memory 210 of FIG. 17. The modified memory region shown in FIG. 19 is referred to with numeral 280. The operation of an EEPROM array has been described above in the description of FIG. 17. For EEPROM cell 261, recall gate 49 of the various cells are connected together to a common node. For array 212 (FIG. 17), recall gates 49 are connected to lines 264 which are then all connected to common node 272. Similarly, for array 214, recall gates 49 are connected to lines 269 and brought to common connection 274. Node 272 will be at a positive voltage for read mode for memory operating mode and PLA operating mode. For writing new information in the EEPROM cell, then node 272 will be at ground potential. Similarly, for memory read mode and PLA operating mode, common connection 274 will be at a positive voltage. To write the EEPROM cell, common connection 274 will be at ground potential. All other connections, such as 260, 262, 266 and 268 function as described for FIG. 17. The functions 240, 242, 250 and 252 have been described in the description of FIG. 17.

Figure 20:
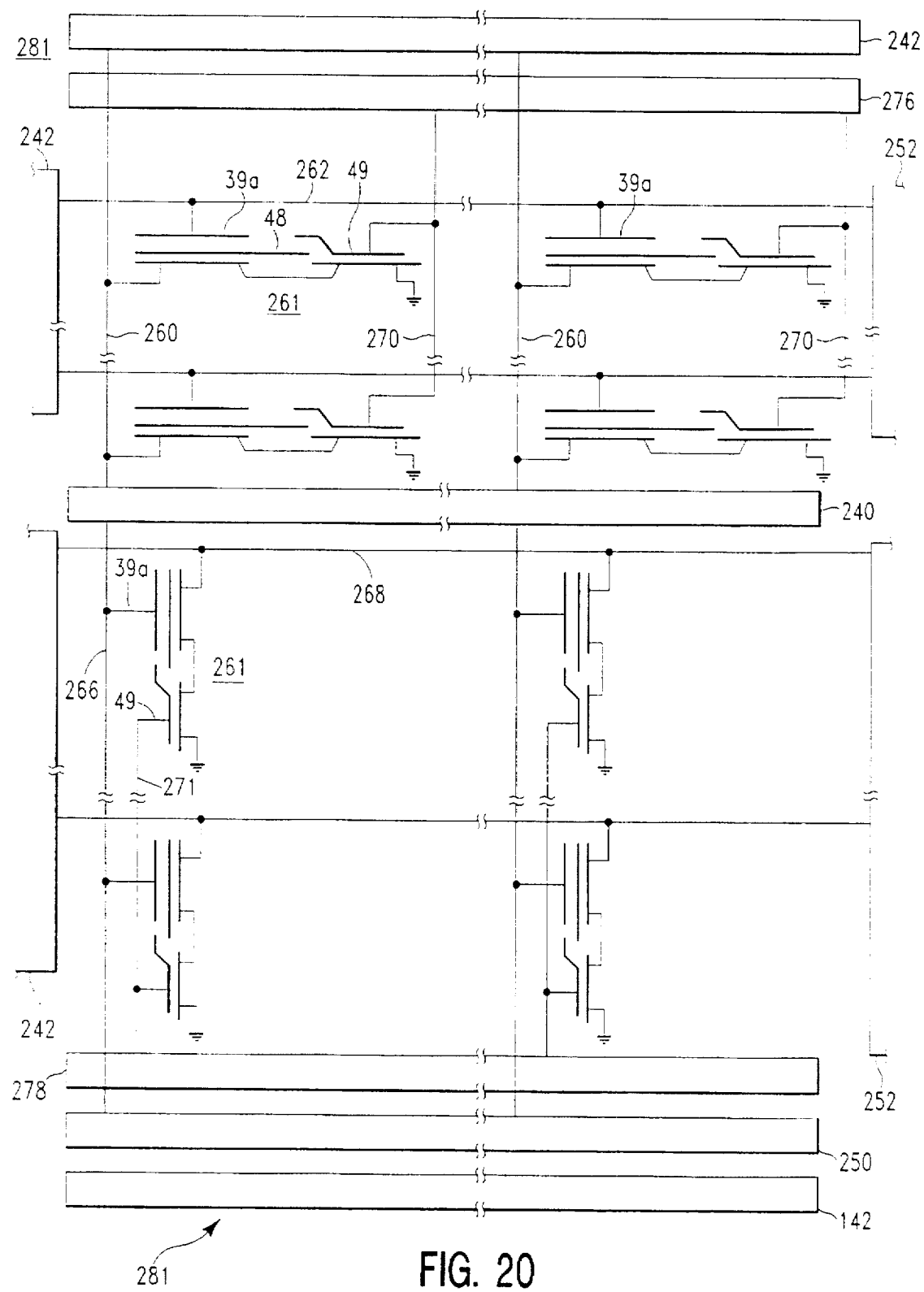
FIG. 20 depicts a variation of the modified EEPROM memory of FIG. 19.

FIG. 20 shows a variation 281 of the implementation of EEPROM cell 261. Recall gates 49 are connected to lines 270 and brought out in columns to recall gate decoder 276 for array 212. For array 214, recall gates 49 are wired into columns 271 and wired to recall gate decoder 278. Recall gate decoders 276 and 278 can connect all recall gates within arrays 212 and 214 to a positive or ground voltage as shown in FIG. 19. In addition, it is now possible to select EEPROM locations within arrays 212 and 214 for additional flexibility. For example several columns of AND array 212 can now be electronically altered during operation of bit partition circuits 244 during PLA operation. For those columns 270 with recall gates 49 grounded, the programmed bits at each location in column 270 is electronically controlled by recall gate decoder 276. It is as if column 270 had not been personalized, independent of the actual personallization of various EEPROM devices in the cell. It is possible to block regions as well as columns, and even individual bits can be altered depending on array layout and decoder configurations. The same electronic masking can be done for OR array 214. The PLA function can thus alter its personalization at electronic speeds for selected devices in the arrays for additional flexibility.

An alternate embodiment of the combined memory and logic array shown in FIG. 17 will be described. In situations where the alteration of the EEPROM array bit states ("1", "0") is required frequently or at high speed, the milliseconds required to alter the logic state of an EEPROM array is unacceptable. Individual programmed bits, columns or blocks can be modified at nanosecond speeds as described above. This is a usefull but limited option which can mask preprogrammed bit locations. A normally on transistor can be changed to off by blocking the connection to ground with the recall gate, however a normally off transistor location cannot be changed to a conducting path. Thus, if there is a requirement to reprogram bit locations at nanosecond speeds, then flip-flop storage can be substituted for EEPROM cells at every AND and OR array location. This could sacrifice density for performance. On the memory side of FIG. 17 (for example 226 and 228), SRAM peripheral circuits are used. These are similar to EEPROM circuits, usually higher performance, with no need for special high voltage programming voltages, and no need for multiple write pulses to the array cells. The combined memory and PLA operation architecture remain similar to FIG. 17, however there are differences in the array wiring and some of the mode selection circuitry is not needed.

Figure 18B:
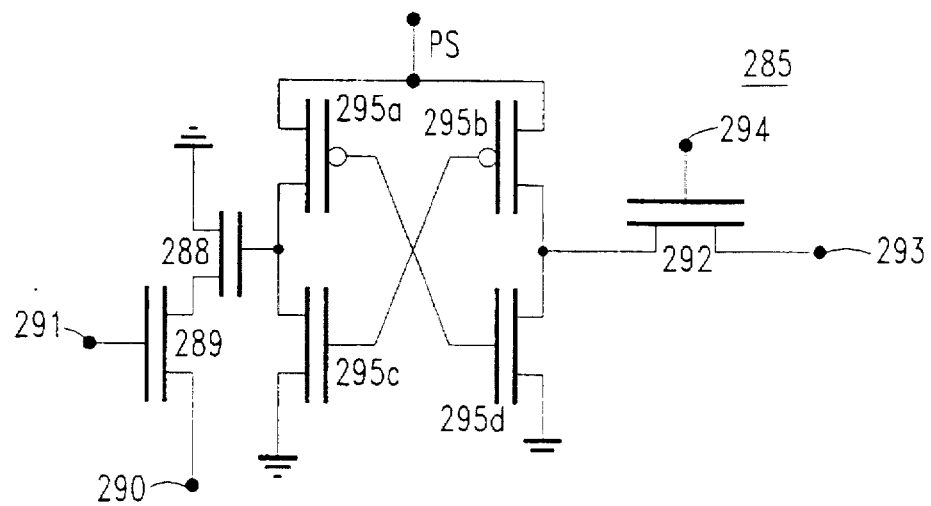
FIG. 18b depicts a flip-flop circuit with a memory select transistor for memory operation and flip-flop controlled transistors for PLA operation.
Figure 21:
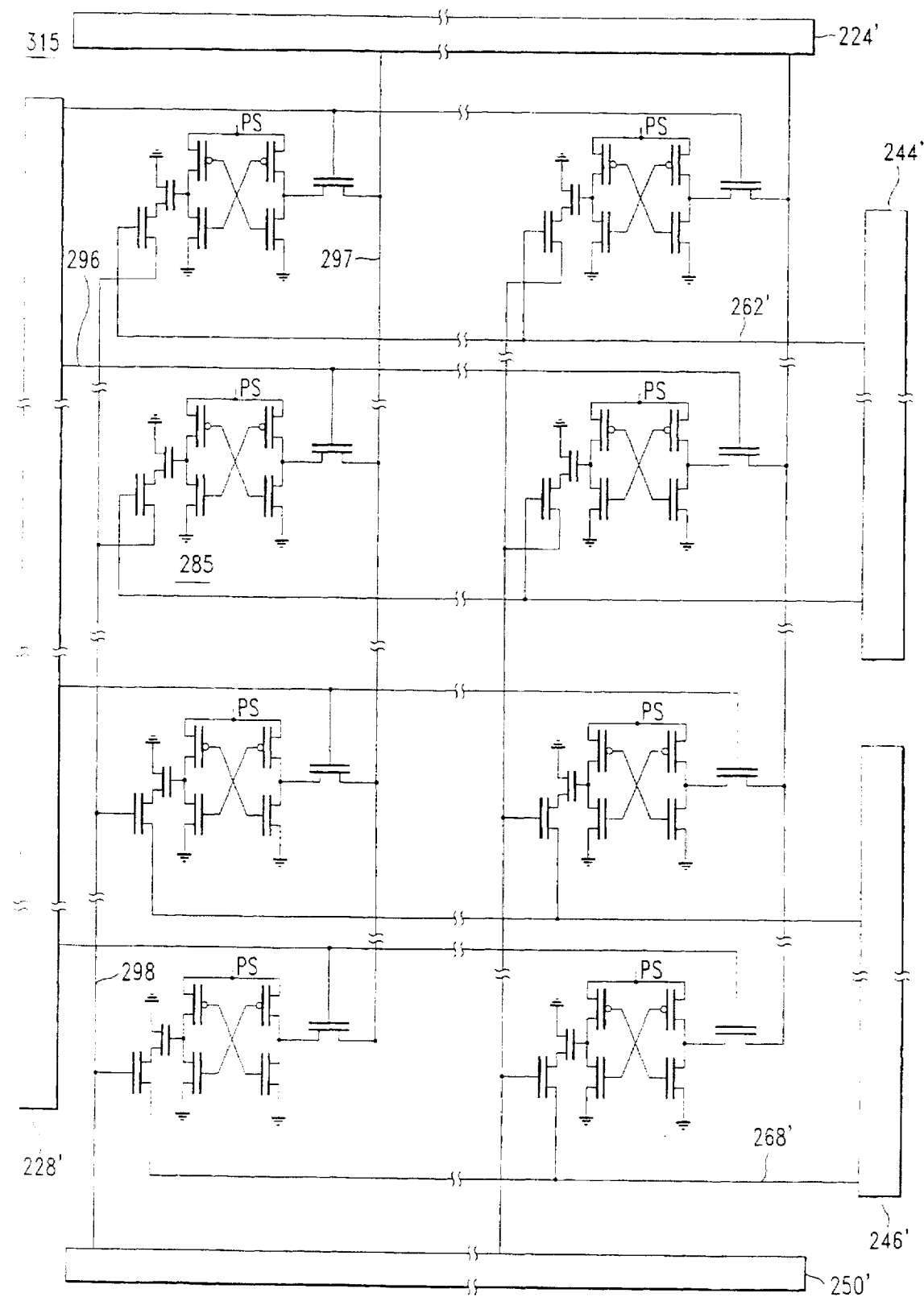
FIG. 21 depicts the flip-flop circuit and associated transistors of FIG. 18b integrated into the combined memory and logic array of FIG. 17.

FIG. 18b shows a CMOS flip-flop with single ended memory read/write transistor 292 on one side and logic transistors 288 and 289 connected to the other side of the flip-flop to control PLA operation. Flip-flop transistors 295a, 295b, 295c, and 295d store a "1" or "0" state. The operation of flip-flops is well understood. CMOS flip-flop operation is described in H. B. Bakoglu, "Circuits, Interconnections, and Packaging for VLSI", Addison-Wesley Publishing Company, 1990, page 144. Transistor 292 is the input/output device for the flip-flop, with node 294 connected to a memory word line and node 293 connected to a memory bit line (FIG. 21). The on/off condition of transistor 288 is controlled by the state of the flip-flop. Transistor 289, in series with 288, is either connected to ground or not connected to ground through transistor 288 depending on the state of the flip-flop. The combination of the storage flip-flop, memory input/output transistor 292, and logic transistors 288 and 289 comprise cell 285. Power supply is shown as P.S. and ground is shown by the ground symbol.

Flip-flop storage in PLA arrays is described in U.S. Pat. No. 4,158,239. FIG. 21 shows the array portion of FIG. 17 re-drawn with combined memory and PLA cell 285. For AND array 212, node 291 is connected to bit partition line 262'. For this particular layout, bit partitioning circuit 244' is connected directly to bit partition line 262' without using mode selection circuit 252 (FIG. 17). The output of transistor 289, node 290 (FIG. 18b), is connected to product term 298 (FIG. 21). Mode select 240 is not needed for this particular array configuration, and product term 298 directly connects AND array 212 with OR array 214. Cell 285 wiring is changed for the OR array, with product term 298 connected to transistor 289 input 291. The output of transistor 289 drives OR array output lines 268'. Row decoder 228' and sense amplifier 224' connect directly to memory terminals 294 and 293, respectively. While cell 285 has been shown as a single input flip-flop two input flip-flops can be used as well. U.S. Pat. No. 4,158,239 describes these array connections for both AND and OR arrays. The flip-flops are NMOS instead of CMOS as commonly used today, however the function concepts are the same. The modifications to FIG. 17 will be apparent to those familiar with the art. With a flip-flop storage cell, state of the art SRAM read and write times of less than 10 nanoseconds are common. At these speeds, PLA bit states can be modified at cycle times of under 10 nanoseconds. The logic function can be changed as often as every logic cycle if desired to optimize the PLA logic function in real time.

Figure 18C:
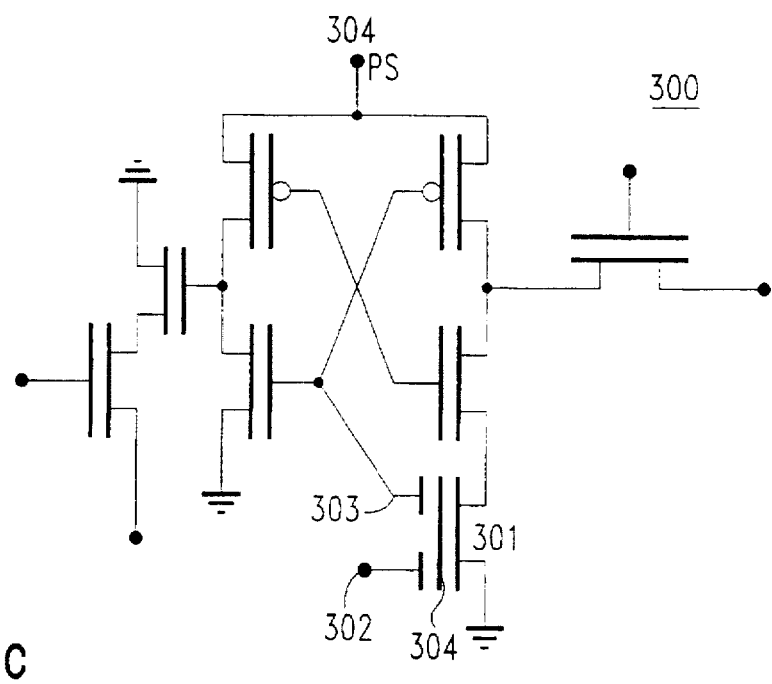
FIG. 18c depicts a flip-flop circuit with a memory select transistor for memory operation, flip-flop controlled transistors for PLA operation, and a non-voltage storage transistor.

The PLA function of FIG. 21 achieves performance at the expense of a non-volatile storage element. In a third embodiment, a non-volatile device can be integrated into a flip-flop storage cell such that it is possible to have the benefits of performance and non-volatility. In FIG. 18c, cell 300 shows cell 285 with the addition of non-volatile transistor 301 and associated connections. The state of transistor 301 is controlled by two gates, both coupling to the floating gate 304 of device 301. Gate 302 is the programming terminal. When a relatively high voltage is applied, typically above 10 volts, the transistor is programmed into a "1" or "0" state. This is accomplished with the presence or absence of electrons on the floating gate 304 of transistor 301. The state is determined by the state of the flip-flop connection to gate 303.

Non-volatile devices may be added to flip-flops in a number of different ways. Various configurations, including cell 300, are described in commonly assigned U.S. Pat. No. 4,388,704 to Bertin et al., incorporated herein by reference in its entirety. The operation of flip-flops with non-volatile elements is described in U.S. Pat. No. 4,388,704.

Figure 22:
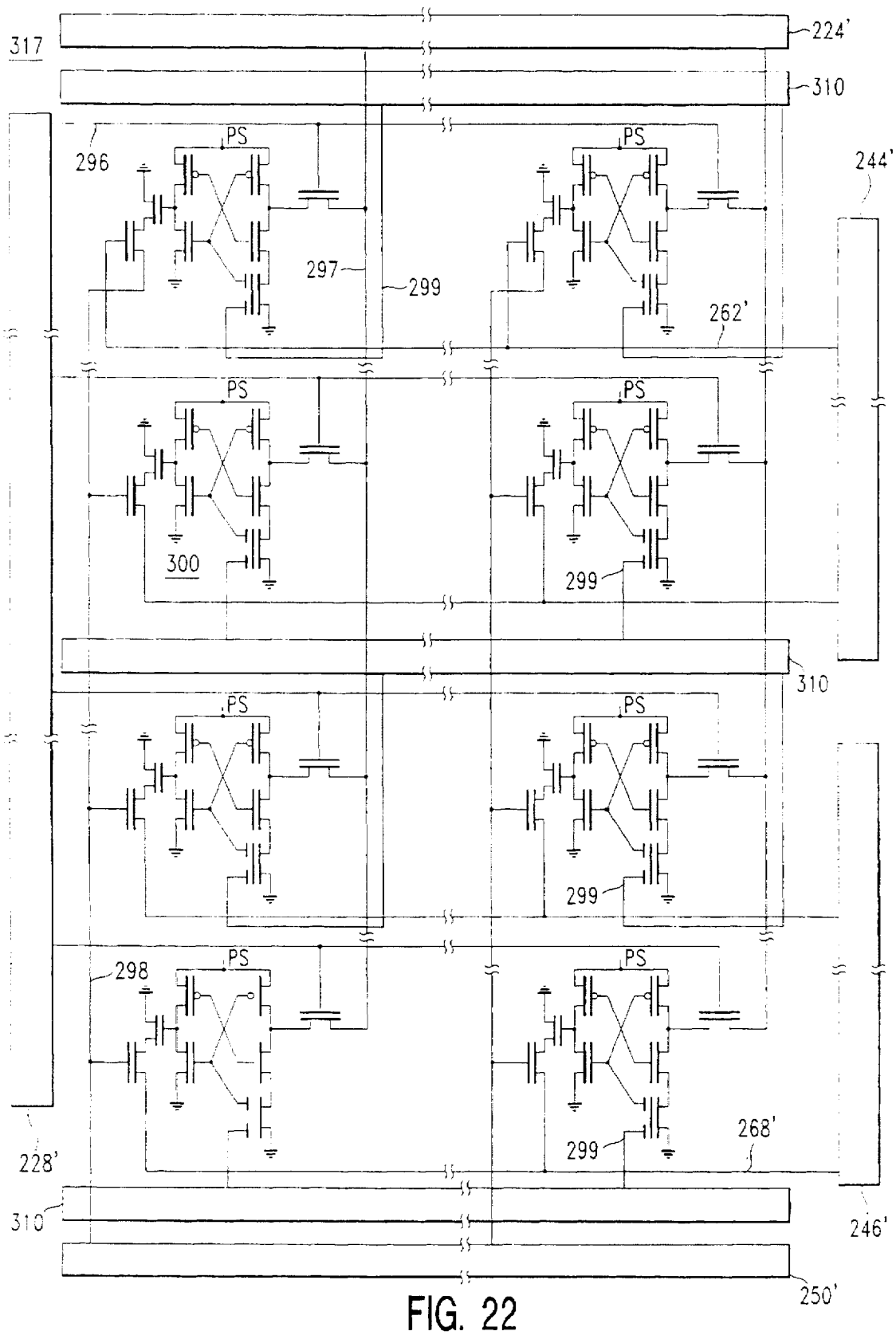
FIG. 22 depicts the flip-flop and associated transistors of FIG. 18c integrated into the combined memory and logic array of FIG. 17.

FIG. 22 shows cell 300 integrated into a combined memory/PLA (logic) array. FIG. 21 has been modified to include programming decoders 310. With gate 302 at a positive voltage, five volts for example, transistor 301 will not program but will provide a current path to ground for the flip-flop if transistor 301 is not in a programmed state with electrons on the floating gate. Memory operation and PLA operation will be as described for FIG. 21 at nanosecond speeds. If non-volatile states are desired for the memory or logic (PLA) function, decoders 310 apply programming voltages to gate 302 via lines 299 and the state of the flip-flop is captured on floating gate 304 of transistor 301. Power can be turned off and the array will retain those memory locations that have been programmed. The memory/logic function can run with some of the storage locations in a non-volatile mode and others in a volatile mode. Details of non-volatile flip-flop operation can be found in U.S. Pat. No. 4,388,704.

Figure 5:
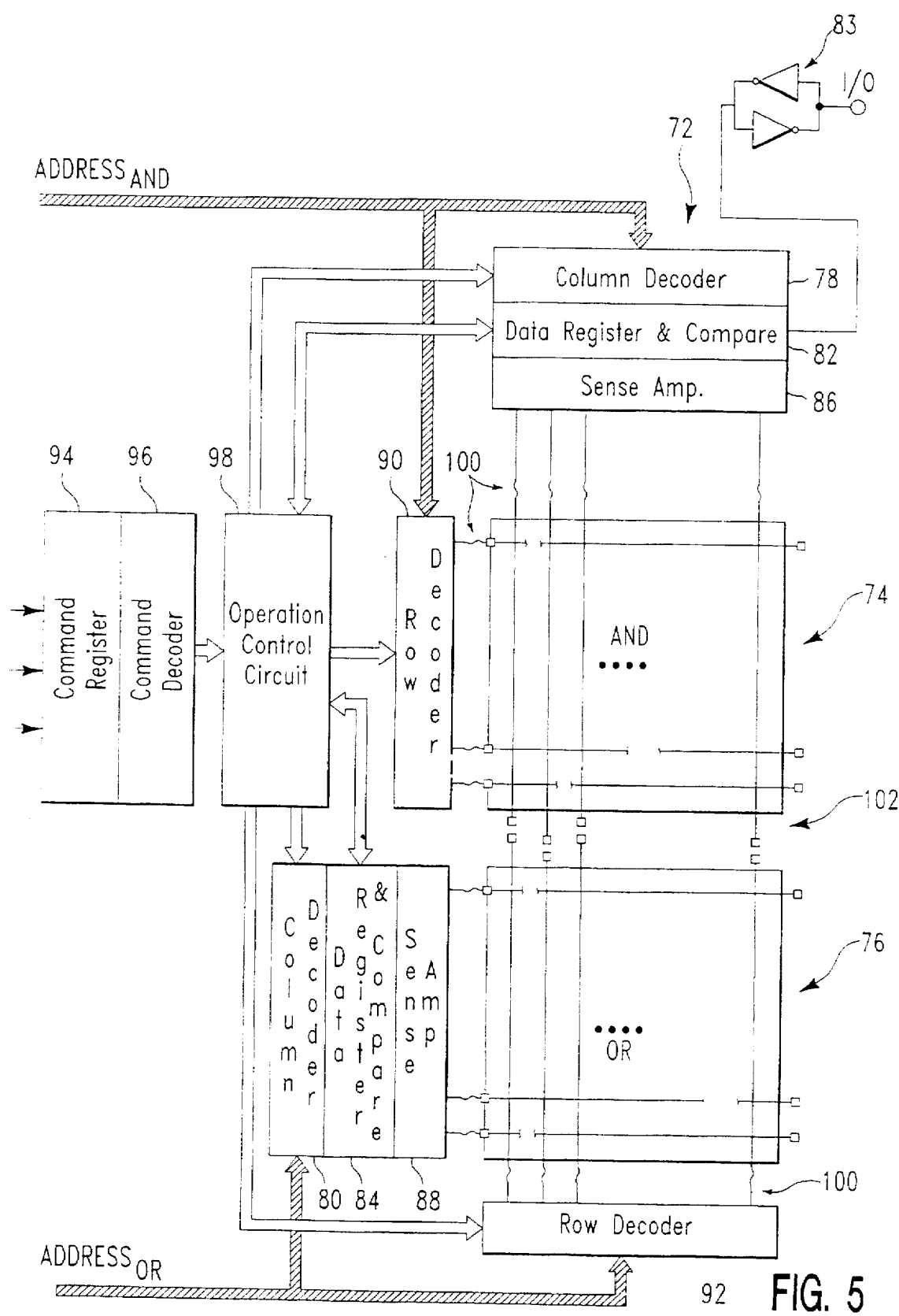
FIG. 5 depicts a version of the EEPROM memory array of FIG. 4 modified for PLA personalization.

FIG. 5 depicts a modified memory 72 on one chip, showing how a conventional EEPROM memory, such as that shown in FIG. 4, is modified for PLA personalization. Modified EEPROM memory 72 is eventually stacked with another chip (see FIG. 7 and description thereof) to provide a PLA according to a second aspect of the present invention. Modified EEPROM memory 72 comprises AND array 74, OR array 76, column decoders 78 and 80, data register and compare circuits 82 and 84, sense amplifiers 86 and 88, row decoders 90 and 92, command register 94, command decoder 96, operational control circuit 98 and fusible links 100. Note that AND array 74 and OR array 76 have not yet been connected and operate as conventional EEPROM arrays. Also note that the column decoder, data register and compare, and sense amplifier have been repeated for both AND array 74 and OR array 76, however, they are shifted 90 degrees for the OR array 76. The arrays are positioned so that the AND and OR array product terms can be connected after personalization of the separate arrays. Command register 94, command decoder 96 and operation control circuit 98 have been modified for the two separate arrays, rather than a single array. Fusible links 100 will eventually be disconnected after programming, verification and testing of the separate arrays is complete. Disconnecting fusible links 100 may be accomplished with a laser. It will be understood that EEPROM control, decode, sense, etc. circuitry will not be powered when operating in PLA mode. A connection approach will be described with respect to FIG. 7.

Figure 6:
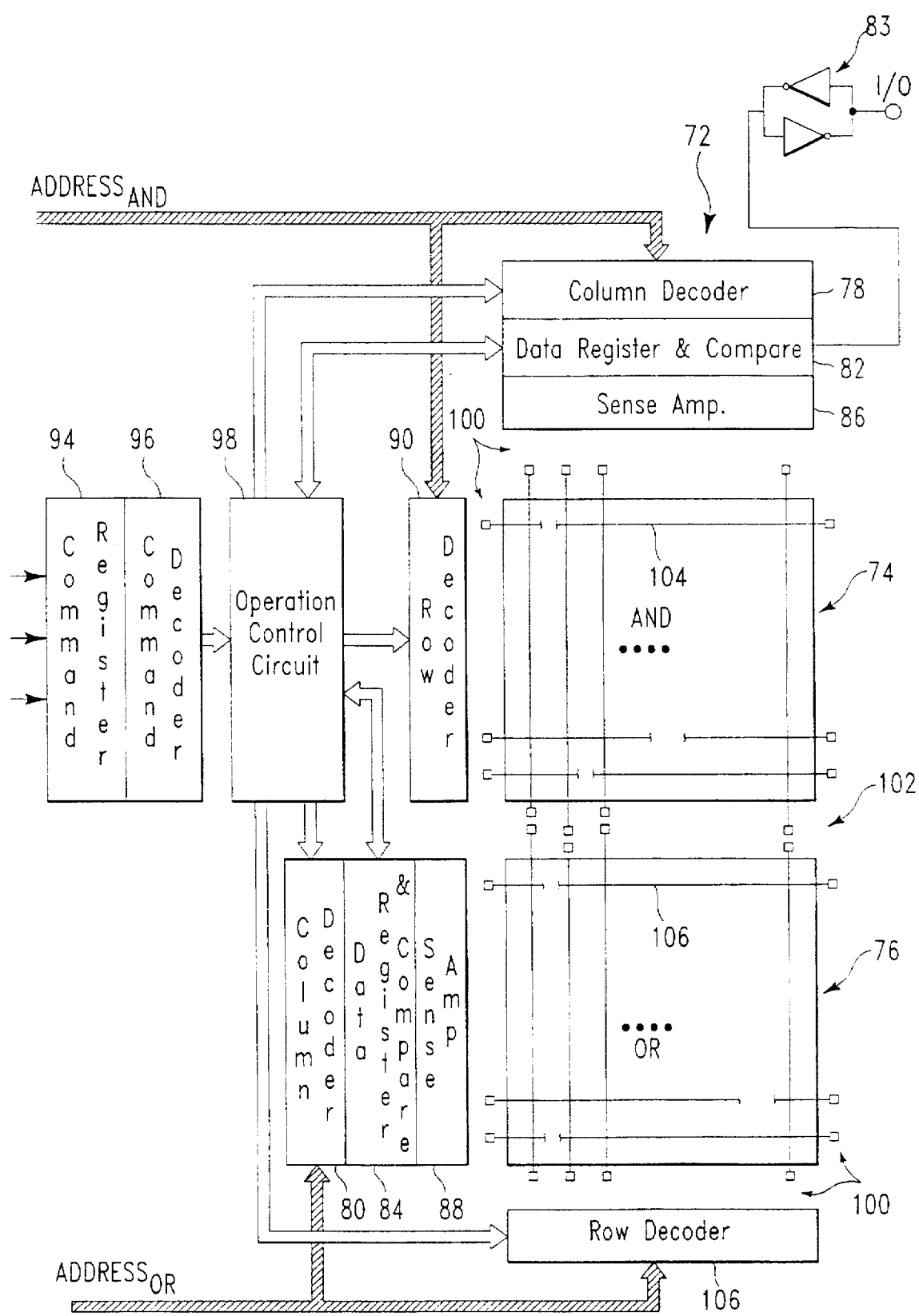
FIG. 6 depicts a modified version of the EEPROM array of FIG. 5.

FIG. 6 depicts the modified EEPROM memory 72 of FIG. 5 with the fusible links 100 disconnected, separating AND array 74 and OR array 76 from the rest of the EEPROM array circuitry. In addition, horizontal array lines in both the arrays have been broken to increase logic efficiency, sometimes referred to as "folding". The breaks in the horizontal array lines insure that bit partitioning circuits on either side of the array (see FIG. 7) are not connected together. The breaks in the horizontal array lines may be accomplished, for example, using a laser. Array connection area 102 is still unconnected as shown. The connections are formed as described with respect to FIG. 7. The modified EEPROM memory 72 of FIG. 6 corresponds to memory array 26 and memory specific circuits 24 of FIG. 2, and will reside on its own semiconductor chip.

Figure 7:
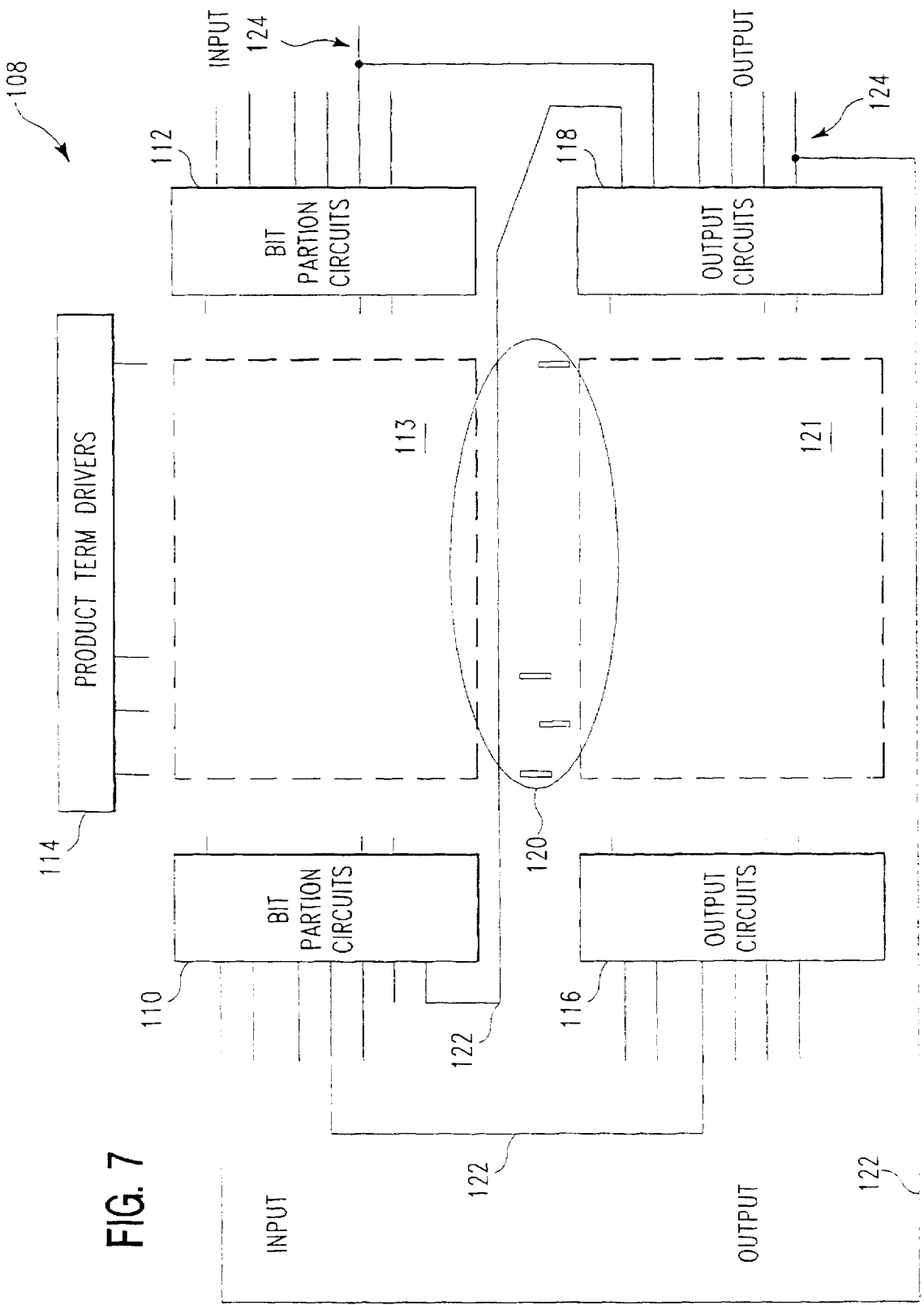
FIG. 7 depicts the layout of a second semiconductor chip to be stacked with the circuitry of FIG. 6 on a first chip.

FIG. 7 depicts the layout 108 for a second semi-conductor chip to be stacked with the chip of FIG. 6. Layout 108 comprises bit partitioning circuits 110 and 112 on either side of area 113, which corresponds to where AND array 74 will fit when the chips are stacked together, product term drivers 114, output circuits 116 and 118, array connections 120 and feedback lines 122. With the stacking of the chip including layout 108 with that of FIG. 6, what was a bit line in the sense of an EEPROM array now becomes a product term line in the sense of a PLA. All of the circuits in layout 108 are preferably prefabricated. Bit partitioning circuits 110 and 112 are conventional logic array functions well known in the art. Output circuits 116 and 118 may be, for example, output latches and/or exclusive-OR gates or other logic at the output of OR array 76. Product term drivers 114 drive the product term lines of AND array 74, and through array connections 120, also drive the product term lines of OR array 76, which corresponds to area 121. In their simplest form, the product term drivers 114 (one driver for each product term line) may be resistors tied to power supplies. Feedback lines 122 are exemplary, the particular number and placement thereof being determined by the logic functions to be performed, and provide the custom PLA output to input feedback required to realize the PLA function. Output circuitry 116 and 118 also provides the ability to store the state of the output of OR array 76. In addition, at some of the outputs (or inputs), there may be dotting, as described above. It will be understood that if the connections between the arrays are made on the chip of FIG. 6, array connections 120 will not be included in layout 108. The circuits and wiring of layout 108 are preferably tested separately and concurrently with the array of FIG. 6, therefore reducing TAT from both a process and test time standpoint. Optionally, the AND array 74 could be segmented with more than two bit partitioning circuits, however, this would require additional fusing.

Figure 8:
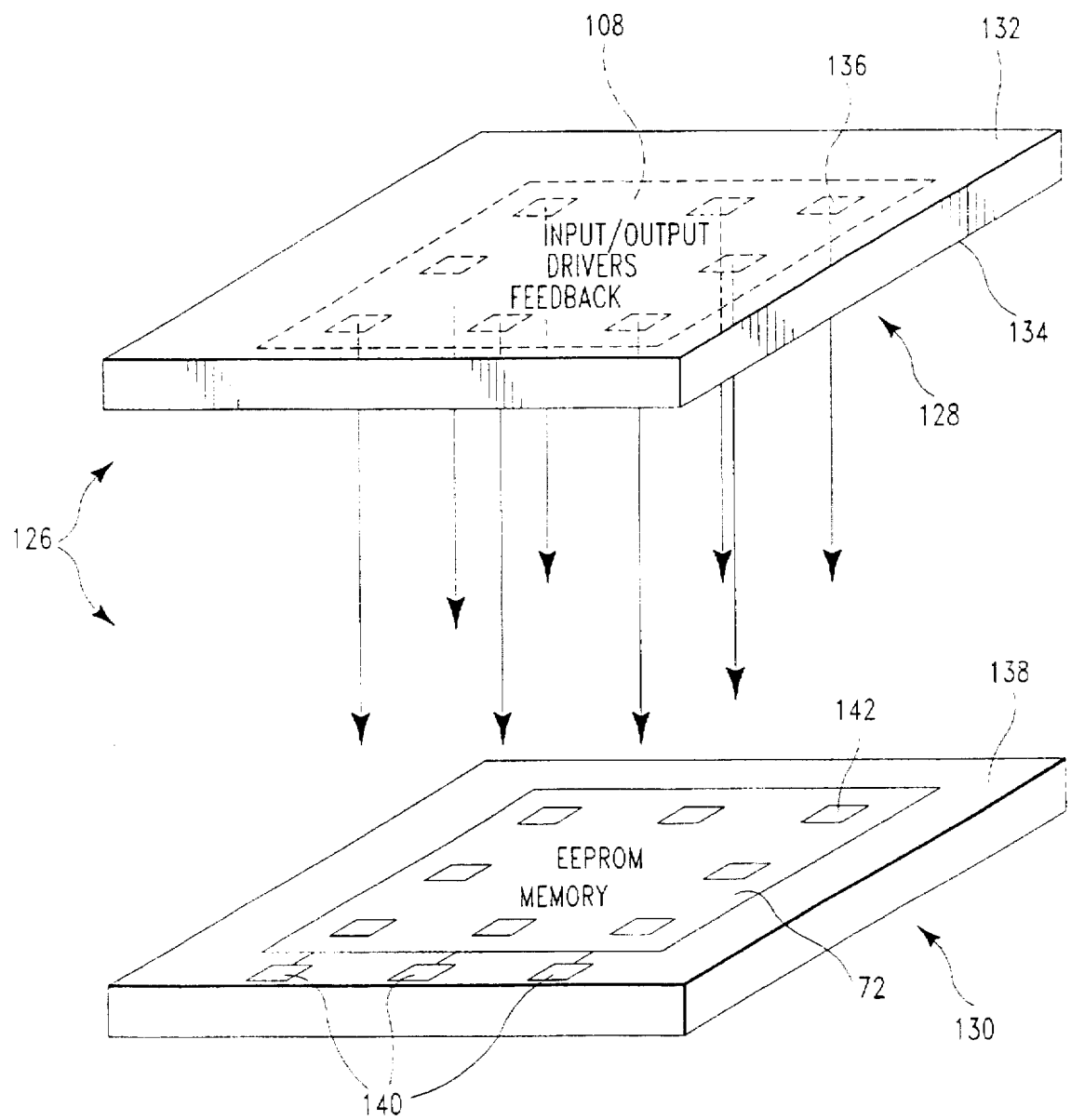
FIG. 8 depicts a three-dimensional programmable logic array according to the present invention.

FIG. 8 depicts a three-dimensional programmable logic array 126 according to a second aspect of the present invention. Three-dimensional PLA 126 comprises top chip 128 and bottom chip 130. Top chip 128 comprises input/output circuitry, drivers and feedback (see FIG. 7), and includes a top surface 132 and a bottom surface 134, layout 108 and several contact pads, for example, contact pad 136. Conventionally, contact pads are made of titanium, aluminum, copper or tungsten. Layout 108 and the contact pads reside on bottom surface 134. Bottom chip 130 comprises a top surface 138 on which resides modified EEPROM memory 72 (see FIG. 6), input/output 140 and several contact pads, for example, contact pad 142. The electrical connections between chips 128 and 130 are made by microconnectors on the contact pads. Contact pads may be sized on the order of three to four microns square to 10 to 20 micrometers in at least one dimension. Preferably, multiple microconnectors are placed on each pad to ensure a proper connection. The microconnectors are preferably formed onto the pads during the semiconductor fabrication process, and are thus fully integrated with the pads. A preferred and alternate embodiment of the microconnectors will now be described in detail.

Figure 9:
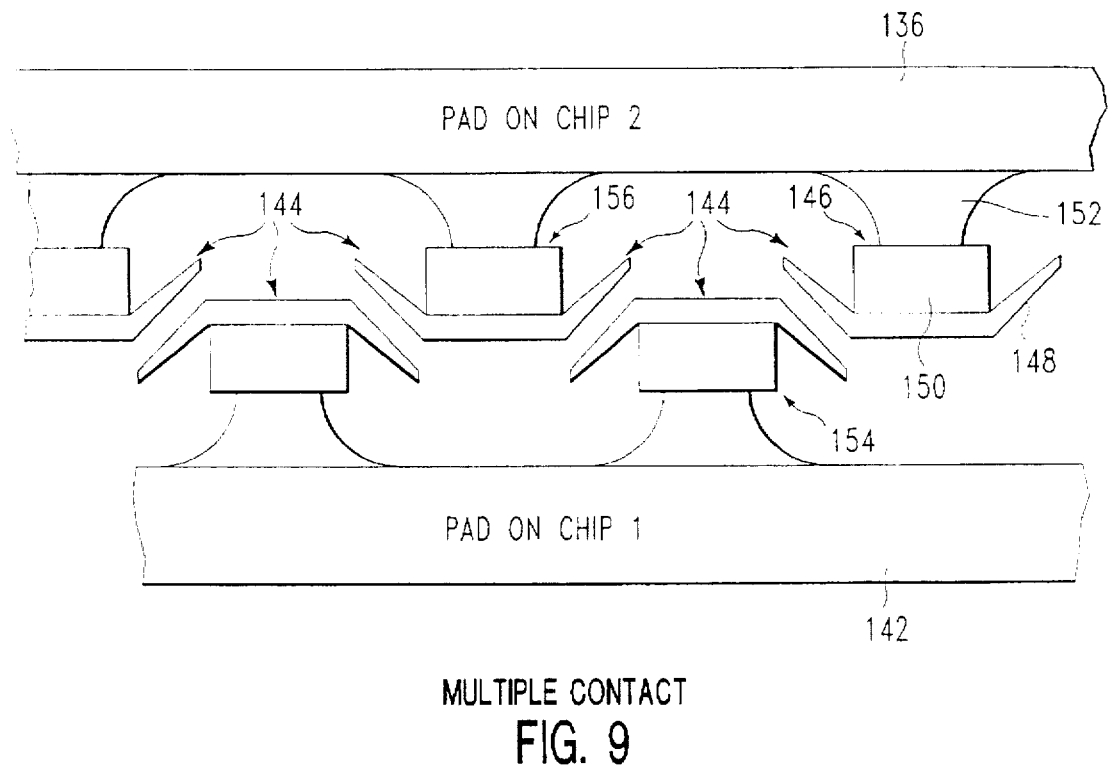
FIG. 9 depicts one embodiment of connectors used to connect the stacked chips of FIG. 8.

FIG. 9 depicts a preferred embodiment of the microconnectors referred to in the above description of FIG. 8, and shows a group 144 of force-responsive self-interlocking microconnectors (hereinafter referred to as "FSCs"). Preferably, the FSCs provide both a physical and an electrical connection. FSCs 144 are disposed on the normal surface of the chips on contact pads 142 and 136 of three-dimensional PLA 126 (see FIG. 8). Each FSC, such as FSC 146, comprises a flexible top 148, post 150 and stem 152. The FSCs may be made of, for example, aluminum, copper or other suitable materials. As bottom chip 130 and top chip 128 are pressed together, the FSC flexible tops bend to allow the insertion of one FSC on a first pad between two FSCs on a second pad. For example, as the chips are pressed together, FSC 154 is inserted between FSCs 156 and 146, with the flexible top of each bending to allow same. Once the flexible top of FSC 154 has cleared the flexible tops of FSCs 156 and 146, the FSCs self-interlock. The more FSCs that are used, the more reliable the physical connection between the chips will be. The FSCs can be analogized to hook-and-loop type closures used for various purposes.

As will be discussed in more detail subsequently, FSCs may be created in apertures by semiconductor processing on a substrate. However, if the FSCs are created in apertures in the normal surface of a chip, when the chips are brought together, the FSCs will not touch, since the normal surface of the chips would lie at the top of the FSCs. In accordance with the present invention, "channels" (i.e., insets and/or mesas) are useful in ensuring that the FSCs come into proper contact with each other. In one embodiment, a channel is a raised region or mesa on which the FSCs are formed. In another embodiment, a channel takes the form of an inset or aperture in a chip in which FSCs are formed.

Figure 10:
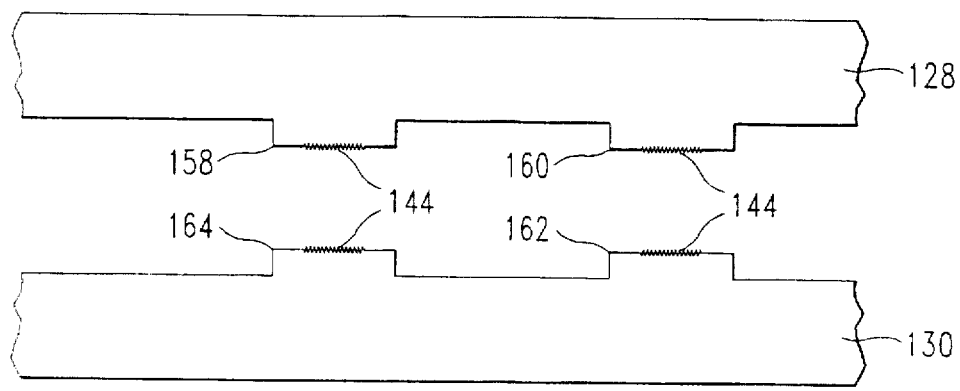
FIG. 10 depicts the connectors of FIG. 9 on raised areas of stacked chips to ensure a proper connection.
Figure 11:
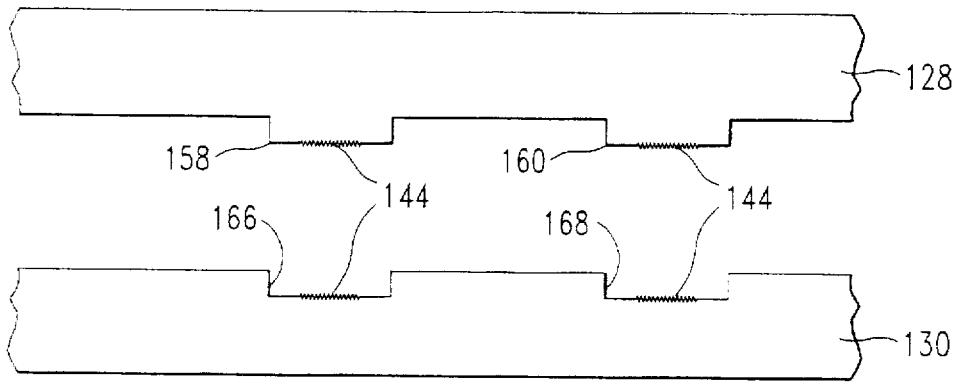
FIG. 11 depicts the connectors of FIG. 9 both on raised areas and in corresponding recessed areas of stacked chips to ensure a proper connection.

FIG. 10 depicts the use of oppositely disposed pedestals on chips 128 and 130 to ensure a proper connection of the microconnectors. Shown in FIG. 10 are pedestals 158, 160, 162 and 164, on which FSCs 144 are created. FIG. 11 depicts the use of a pedestal-inset pair to ensure a proper FSC connection. When chip 128 is placed on top of chip 130, pedestal 158 fits into inset 166, and pedestal 160 fits into inset 168. Depending on the height of a pedestal in a pedestal-inset pair, as compared to the inset, one can create a gap between chips 128 and 130 if desired. In the example described herein, the use of two pedestals, as shown in FIG. 10, is preferred, since it allows for common processing of the chips and provides a clear gap between the chips for clearance between the oppositely facing circuitries thereof. Note that more than two layers of chips could be used with channels on either side of the interior chips of the stack. Two chips are depicted in FIGS. 10 and 11 for ease of illustration only. A gap of predetermined dimensions may be used for the flow of a liquid or gas for cooling purposes as needed.

In order to minimize the disturbance to the circuitry on a chip, one needs to decide whether to build the FSCs prior to normal chip processing or after. When making an inset in a chip, it is preferably done prior to normal chip processing. Once the inset is made, and the FSCs made therein, the channel could be filled with, for example, an oxide film prior to normal chip processing. After normal chip processing, the oxide film could be removed without damage to the FSCs from the normal chip processing. By similar rationale, FSCs on a mesa are preferably made after normal chip processing, since the chip circuitry could be covered to protect it during the making of the FSCs.

Figure 12A:
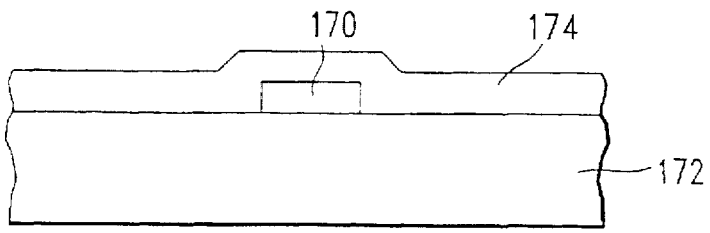
FIGS. 12a–12f depict a connector of FIG. 9 at various stages of processing.
Figure 12B:
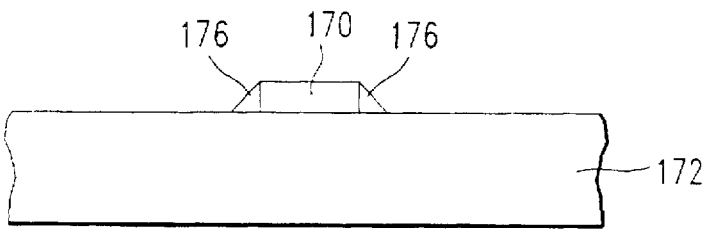
Figure 12C:
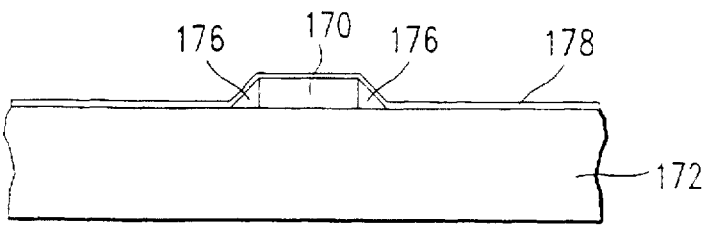
Figure 12D:
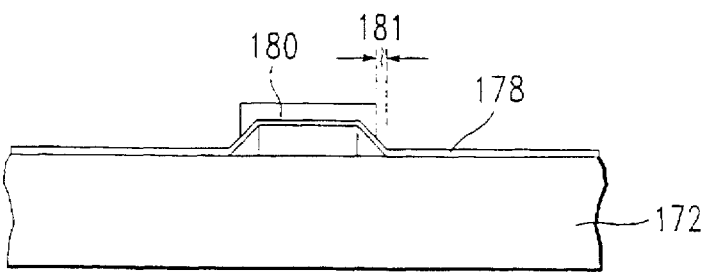
Figure 12E:
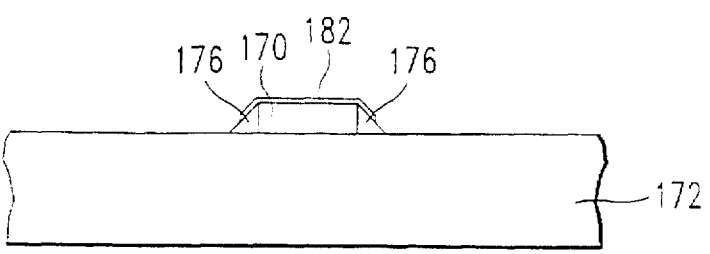
Figure 12F:
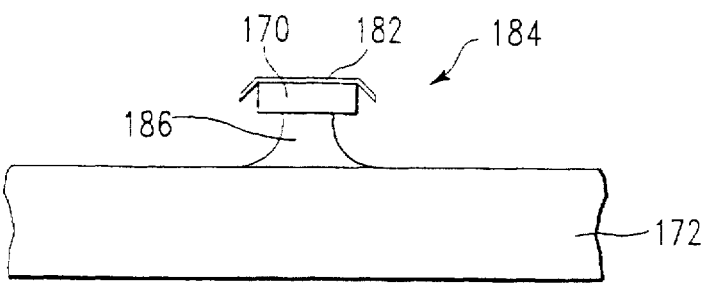

A general description of the process for making an FSC will now be discussed. Subsequently, possible materials for use in the described process of making will be listed. FIG. 12a depicts a cross-sectional view of a block or post 170 created on a substrate or base 172. Material 174 is deposited over post 170 and base 172 such that a slope is created on the side walls of post 170. This might be done, for example, by spin applying material 174. After depositing material 174, it is then directionally etched back to define mandrel flair-out portions 176 shown in FIG. 12b. Note that the directional etch need not be selective to base 172. As shown in FIG. 12c, a conformal material 178 is applied over the post 170 and mandrel flair-out portions 176. A mask 180 is then created over conformal material 178 covering post 170 and mandrel flair-out portions 176, as shown in FIG. 12d. The mask 180 is defined over mandrel flair-our portions 176, but does not completely cover same, leaving overlap region 181, which will allow for the subsequent removal of portions 176. The portion of the conformal material 178 not covered by mask 180 is etched away, and the mask is removed. As shown in FIG. 12e, this creates flexible top 182. Base 172 and mandrel flair-out portions 176 are then etched away to form FSC 184 (shown in FIG. 12f), comprised of flexible top 182, post 170 and stem 186 on top of what is left of base 172 after creating stem 186.

The materials chosen for the various sections of FSC 184 shown are preferably chosen such that the material used for flexible top 182 adheres well to post 170, post 170 adheres well to stem 186, and stem 186 adheres well to base 172. Mandrel flair-out portions 176 are preferably removable without affecting flexible top 182. Stem 186 and base 172 need not be the same material, although they could be. If different materials, a different etch may be needed for each. Also, post 170 is preferably of a different etch characteristic than mandrel flair-out portions 176, if retention of the shape of post 170 is desired. If post 170 and stem 186 were the same material, the etch to create stem 186 would create a semicircle from base 172 up to flexible top 182, since post 170 would also be etched. The choice of materials will of course depend on the situation. The chart below lists different possible exemplary combinations of materials. The preferred embodiment of the materials listed is case 1, since it combines the simplest materials to work with, spin-on glass is relatively inexpensive, and nitride is physically very flexible and has the best etch rate relative to oxide (i.e., it holds up well to an oxide etch). Case 1 being the preferred embodiment assumes that the semiconductor chip after normal processing had an insulator of oxide thereover. If the chip had an insulator of polyimide thereon, case 11 would be the preferred choice, since base 172 would be of the same material.

TABLE #1

| | MATERIALS | | | | |
|---|---|---|---|---|---|
| | POST | MANDREL FLAIR-OUT POTRIONS | FLEX-IBLE TOP | STEM | BASE |
| Case 1 | nitride | spin-on glsss | nitride | oxide | oxide |
| Case 2 | nitride | spin-on glass | metal | oxide | oxide |
| Case 3 | metal | spin-on glass | metal | oxide | oxide |
| Case 4 | nitride | spin-on glass | nitride | oxide (fast etch) | oxide (slow etch) |
| Case 5 | nitride | spin-on glass | metal | oxide (fast etch) | oxide (slow etch) |
| Case 6 | metal | spin-on glass | metal | oxide (fast etch) | oxide (slow etch) |
| Case 7 | nitride | spin-on glass | nitride | silicon | silicon |
| Case 8 | nitride | spin-on glass | metal | silicon | silicon |
| Case 9 | metal | spin-on glass | metal | silicon | silicon |
| Case 10 | oxide | spin-on glass | nitride | polyimide | polyimide |
| Case 11 | nitride | oxide | nitride | polyimide | polyimide |
| Case 12 | oxide | oxide | nitride | oxide | polyimide |
| Case 13 | polyimide | spin-on glass | nitride | polyimide | polyimide |
| Case 14 | oxide | spin-on glass | metal | polyimide | polyimide |
| Case 15 | nitride | oxide | metal | polyimide | polyimide |
| Case 16 | oxide | oxide | metal | oxide | polyimide |
| Case 17 | polyimide | spin-on glass | metal | polyimide | polyimide |
| Case 18 | metal | oxide | nitride | metal | metal |
| Case 19 | metal | oxide | metal | metal | metal |
| Caae 20 | metal | polyimide | metal | metal | metal |
| Case 21 | metal | spin-on glass | oxide | metal | metal |
| Case 22 | nitride | spin-on glass | nitride | metal | metal |
| Case 23 | metal | oxide | nitride | metal type 2 | metal type 1 |
| Case 24 | metal | oxide | metal | metal type 2 | metal type 1 |
| Case 25 | metal | polyimide | metal | metal type 2 | metal type 1 |
| Case 26 | metal | spin-on glass | oxide | metal type 2 | metal type 1 |
| Case 27 | nitride | spin-on glass | nitride | metal type 2 | metal type 1 |

In the table above, "metal type 1" and "metal type 2" are simple metals with etches selective to each other, for example, aluminum and tungsten.

Figure 13:
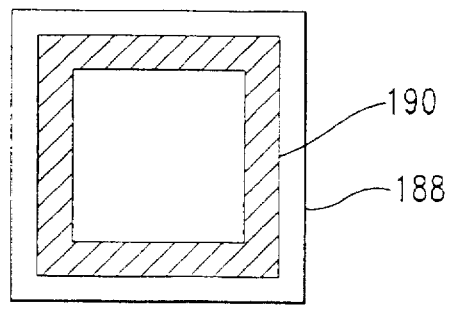
FIG. 13 depicts the connectors of FIG. 9 in one continuous channel (i.e., a recessed or raised area) near the outer edge of a chip.
Figure 14:
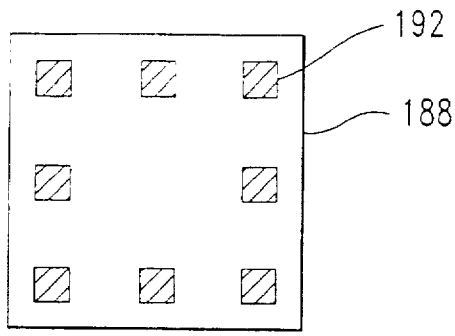
FIG. 14 depicts the connectors of FIG. 9 in multiple channel areas near the outer edge of a chip.

The microconnector areas shown in FIG. 8 are merely exemplary, and can take many other forms. For example, FIG. 13 depicts a top view of a chip 188 with a continuous channel 190 thereon. Channel 190 may not be the optimum choice where wires must come out from chip 188. As another example, FIG. 14 depicts a top view of chip 188 with localized channels 192 placed toward the edges of chip 188. Note that the shape of channels 190 or 192 could be different, depending on the need.

An electrical connection between stacked chips can be accomplished by an electrical connection separate from the FSCs, or by choosing the materials for the FSCs such that the FSCs themselves act as conductors. For a separate electrical connection, a reflowable connection is preferably used. A "reflowable connection" is one where the connection is made after heat is applied, for example, a small ball of solder heated to flow and connect between the two chips. Only a small amount of the reflowable material would be needed to give an electrical connection, since the FSCs actually provide the mechanical strength holding the chips together. The FSCs themselves may act as electrical conductors if the materials for the flexible top, mandrel stem and base are all electrical conductors, such as Case 19 in the table above.

Figure 15:
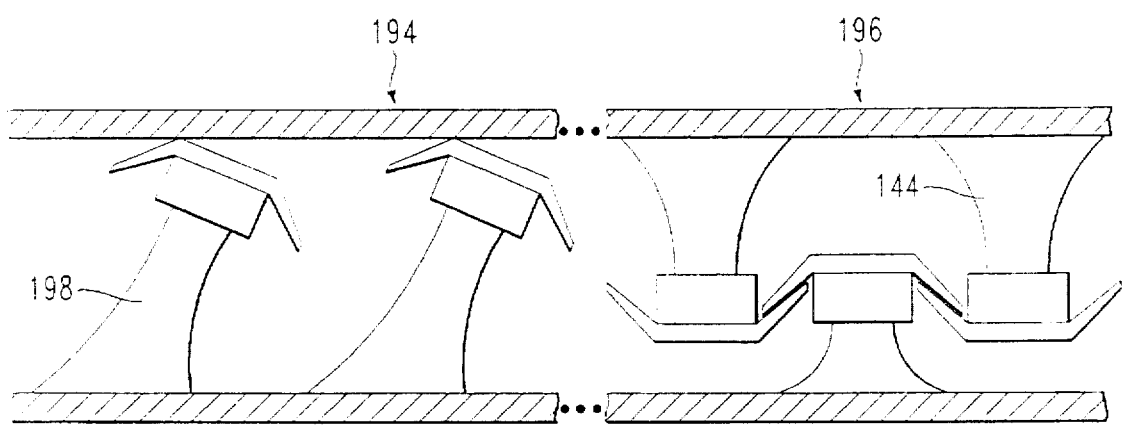
FIG. 15 depicts the connectors of FIG. 9 with repelling members on the same chip stack to provide a force-counterforce arrangement.

To ensure a proper electrical connection, the present invention includes a force-counter-force connection to ensure that the FSCs remain in proper contact. FIG. 15 depicts repelling member area 194 and FSC area 196, both part of a pair of stacked chips according to the present invention. Repelling member area 194 comprises repelling members 198 shown with a slight bend, providing the pushing force countering the FSCs in area 196. Repelling members 198 resemble FSCs, except that their stem is longer and they do not interconnect. The FSCs in area 196 are those described with respect to FIG. 9, and provide the restraining action against the repelling members in area 194. Where the stacked chips include both areas 194 and 196, which act against each other, proper contact ensuring an electrical connection is maintained. In addition, the repelling members in area 194 may or may not be conductive, regardless of whether the FSCs in area 196 are conductive. One approach is to include conductive repelling members 198 on the pads of FIG. 8 with FSCs on other portions of the chip.

Figure 16:
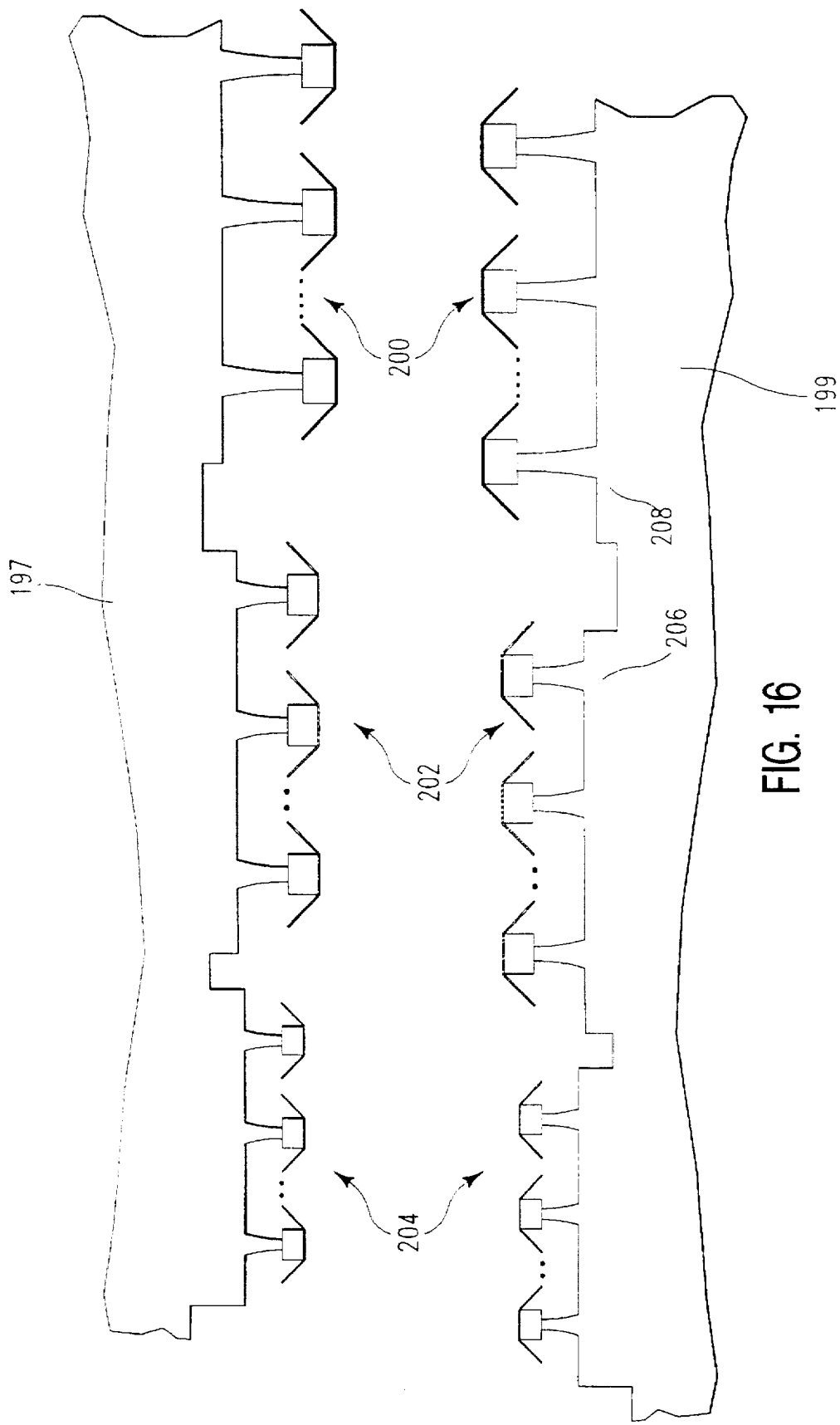
FIG. 16 depicts varying sizes of the connectors of FIG. 9 to provide gross to fine alignment of chips when stacked.

When stacking certain chips face to face, such as the PLA described herein, alignment may need to be very precise. When stacking a circuitry face to a circuitry face, it is difficult to view and align the stacked chips, unless some system such as optical alignment is used. Alternatively, including FSCs of differing heights will help to align the chips in varying degrees as they are being pushed together. FIG. 16 depicts top chip 197 and bottom chip 199 with large FSCs 200, medium FSCs 202 and small FSCs 204. Note that the mesa 206 for medium-sized FSCs 202 is larger than mesa 208 for large FSCs 200. If the mesas were not of differing heights, the medium and small FSCs would never touch when large FSCs 200 are locked into place. Large FSCs 200 provide gross alignment, medium FSCs 202 provide medium alignment, and small FSCs 204 provide a fine alignment. Larger FSCs are both wider and longer than smaller ones. The width can be controlled by the etch after material 178 in FIG. 12c is placed. The height can be controlled by the etch done between FIGS. 12e and 12f to create stem 186. In addition, material 178 for the flexible tops could be thicker to make the FSCs taller, and thinner to make them shorter. Although thicker, flexibility is not seriously affected, since the flexing extension portion is wider than it is with the smaller FSCs.

An alternative microconnector structure and method of making same can be found in U.S. Pat. No. 5,202,754, entitled "Three-Dimensional Multi-Chip Packages and Methods of Fabrication," issued to Bertin et al. on Apr. 13, 1993, and assigned to IBM, which is herein incorporated by reference in its entirety. A highly conductive material, such as gold, is placed on a given connection pad. A thermid adhesive material may then be used to keep the gold bumps on the pads of chips 130 and 132 in contact.

Briefly, the gold could, for example, be deposited by sputtering. A thin layer of titanium, on the order of 1000 angstroms, is evaporated onto a pad, then gold is sputtered on relatively thick, for example, 3-4 µm. Thick gold can also be obtained, for example, by a plating process. Using any of several conventional methods, the insulating thermid adhesive, compatible with polyimide-type dielectrics, is deposited on the gold bumps. A combination of pressure and temperature (less than 400° C.) causes the thermid adhesive to flow away from the contact area, and causes slight deformation of the gold bumps. Once the thermid adhesive cools, it bonds and holds the gold bumps in contact. The connection structure of U.S. Pat. No. 5,202,754 includes the use of a filled trench technology to achieve a front-to-back connection, which is not necessary in the present invention, since it is preferably a front-to-front connection. However, access to the back side of chips 50 and 56 could be provided. Alternatively, chips could be assembled front to back if at least one chip has front-to-back contacts. Finally, microconnectors can be used to hold gold to gold contacts between chip surfaces as an alternative to thermid adhesive.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A programmable logic array (PLA), comprising:
   a plurality of memory cells and memory circuits, wherein said memory circuits allow operation of said memory cells for storage apart from said PLA, wherein said plurality of memory cells and memory circuits comprises:
      a first memory array having a plurality of inputs, a plurality of outputs and being arranged in rows and columns, said first memory array acting as an AND array and said plurality of columns acting as product term lines;
      a second memory array coupled to said first memory array having a plurality of inputs, a plurality of outputs and being arranged in rows and columns, said second memory array acting as an OR array and said plurality of columns acting as product term lines;
   PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs; and
   mode selection circuitry permitting operation of said plurality of memory cells as a memory apart from said PLA.

2. The PLA of claim 1 wherein said plurality of outputs comprises output logic.

3. The PLA of claim 1 wherein said plurality of outputs comprise a plurality of output latches.

4. The PLA of claim 1, wherein said memory cells each comprise a logic circuit and a flip flop.

5. The PLA of claim 1, wherein each of said plurality of memory cells is independently addressable, thereby allowing operation thereof for storage apart from said PLA.

6. The PLA of claim 1 wherein each of said plurality of memory cells comprises a transistor, a flip-flop controlling gate bias on said transistor, and a non-volatile transistor.

7. The PLA of claim 6, wherein each of said plurality of memory cells further comprises an additional transistor coupled to said transistor for sensing said transistor.

8. The PLA of claim 6, wherein each of said plurality of memory cells further comprises an additional transistor coupled to said flip-flop for setting a state of said flip-flop.

9. A programmable logic array (PLA), comprising:
   a plurality of memory cells and memory circuits, wherein said memory circuits allow operation of said memory cells for storage apart from said PLA, and wherein said plurality of memory cells comprises a plurality of electrically erasable read only memory (EEPROM) cells; and
   PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs.

10. The PLA of claim 9 wherein said plurality of EEPROM cells comprises a plurality of direct-write EEPROM cells.

11. A programmable logic array (PLA), comprising:
 a plurality of memory cells and memory circuits, wherein said memory circuits allow operation of said memory cells for storage apart from said PLA; and
 PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs, wherein said plurality of inputs comprises a plurality of bit partitioning input circuits.

12. A programmable logic array (PLA), comprising:
 a plurality of memory cells and memory circuits, wherein said memory circuits allow operation of said memory cells for storage apart from said PLA;
 PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs; and
 a plurality of drivers for driving said plurality of memory cells.

13. A programmable logic array (PLA), comprising:
 a plurality of memory cells and memory circuits, wherein said memory circuits allow operation of said memory cells for storage apart from said PLA, wherein each of said plurality of memory cells comprises a transistor and a flip-flop controlling gate bias on said transistor; and
 PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs.

14. The PLA of claim 13, wherein each of said plurality of memory cells further comprises an additional transistor coupled to said transistor for sensing said transistor.

15. The PLA of claim 13, wherein each of said plurality of memory cells further comprises an additional transistor coupled to said flip-flop for setting a state of said flip-flop.

16. A programmable logic array (PLA), comprising:
 a plurality of memory cells and memory circuits, wherein said plurality of memory cells reside on a first semiconductor chip; and
 PLA logic circuitry coupled to at least some of said plurality of memory cells, said PLA logic circuitry comprising a plurality of inputs, a plurality of outputs, and a feedback connection between at least one of said plurality of outputs and at least one of said plurality of inputs, and wherein said PLA logic circuitry resides on a second semiconductor chip stackable with said first semiconductor chip, said PLA further comprising a plurality of connectors for connecting said first semiconductor chip and said second semiconductor chip.

17. The PLA of claim 16 wherein said plurality of connectors comprise a plurality of force-responsive self-interlocking microconnectors disposed on each of aid first semiconductor chip and said second semiconductor chip.

18. The PLA of claim 17 wherein said plurality of force-responsive self-interlocking microconnectors provide both a physical and an electrical connection between said first semiconductor chip and said second semiconductor chip.

19. The PLA of claim 17, wherein said plurality of connectors further comprise a plurality of repelling members disposed on one of said first semiconductor chip and said second semiconductor chip, said plurality of repelling members tending to push away a semiconductor chip coming into contact therewith, and said plurality of force-responsive self-interlocking microconnectors tending to pull said first semiconductor chip and said second semiconductor chip together, thereby providing a force-counter-force arrangement.

20. The PLA of claim 17, wherein said plurality of force-responsive self-interlocking microconnectors comprise a plurality of sizes providing differing alignment accuracy.

21. The PLA of claim 16, each of said first semiconductor chip and said second semiconductor chip further comprising at least one channel in which resides at least one of said plurality of connectors.

22. The PLA of claim 15, wherein said plurality of connectors comprise a plurality of metal bumps oppositely disposed on a facing surface of each said semiconductor chip, said PLA further comprising a means for connecting corresponding said oppositely disposed plurality of metal bumps, thereby providing both a physical and an electrical connection.

23. The PLA of claim 22, wherein said plurality of metal bumps comprise a plurality of gold bumps.

24. The PLA of claim 16 further comprising mode selection circuitry residing on one of said first semiconductor chip and said second semiconductor chip and permitting operation of said plurality of memory cells as a memory apart from said PLA.

25. The PLA of claim 16, wherein said plurality of outputs comprises output logic.

26. The PLA of claim 16, wherein said plurality of outputs comprises a plurality of output latches.

27. The PLA of claim 16 wherein each of said plurality of memory cells comprises a transistor and a flip-flop controlling gate bias on said transistor.

28. The PLA of claim 16 wherein each of said plurality of memory cells comprises a transistor, a flip-flop controlling gate bias on said transistor, and a non-volatile transistor.

29. A method of making a programmable logic array (PLA), comprising:
 (a) providing a first memory array having a plurality of inputs, a plurality of outputs and being arranged in rows and columns, wherein said first memory array acts as an AND array, and wherein said plurality of columns act as product term lines;
 (b) providing a second memory array having a plurality of inputs, a plurality of outputs and being arranged in rows and columns, wherein said second memory array acts as an OR array, and wherein said plurality of columns act as product term lines;
 (c) programming said first memory array and said second memory array;
 (d) electrically coupling said plurality of columns of said first memory array with said plurality of columns of said second memory array;
 (e) providing PLA logic circuitry having a plurality of inputs and a plurality of outputs;
 (f) electrically coupling at least one of said plurality of outputs of said PLA logic circuitry with at least one of said plurality of inputs of said PLA logic circuitry, thereby providing at least one feedback connection;
 (g) electrically coupling at least some of said plurality of inputs of said first memory array with at least some of said plurality of inputs of said PLA logic circuitry;

(h) electrically coupling at least some of said plurality of outputs of said second memory array with at least some of said plurality of outputs of said PLA logic circuitry; and (i) providing a plurality of memory circuits to allow operation of said first memory array and said second memory array for storage apart from said PLA.

30. The method of claim 29, wherein said first memory array comprises a first EEPROM memory array, wherein said second memory array comprises a second EEPROM memory array, and wherein said step (c) comprises programming said first EEPROM memory array and said second EEPROM memory array.

31. The method of claim 29 wherein said step (f) comprises electrically coupling through feedback circuitry.

32. The method of claim 29 wherein said steps (g) and (h) each comprise electrically coupling through a plurality of pass gates.

33. The method of claim 29, wherein each of said first memory array and said second memory array has independently addressable memory cells, thereby allowing operation thereof for storage apart from said PLA.

34. A method of making a programmable logic array (PLA), comprising:

(a) providing a first memory array having a plurality of inputs, a plurality of outputs and being arranged in rows and columns;

(b) providing a second memory array having a plurality of inputs, a plurality of outputs and being arranged in rows and columns, wherein said steps (a) and (b) comprise providing on a first semiconductor chip;

(c) programming said first memory array and said second memory array;

(d) electrically coupling said plurality of columns of said first memory array with said plurality of columns of said second memory array;

(e) providing PLA logic circuitry having a plurality of inputs and a plurality of outputs, and wherein said step (e) comprises providing on a second semiconductor chip;

(f) electrically coupling at least one of said plurality of outputs of said PLA logic circuitry with at least one of said plurality of inputs of said PLA logic circuitry, thereby providing at least one feedback connection;

(g) electrically coupling at least some of said plurality of inputs of said first memory array with at least some of said plurality of inputs of said PLA logic circuitry; and (h) electrically coupling at least some of said plurality of outputs of said second memory array with at least some of said plurality of outputs of said PLA logic circuitry, said method further comprising steps of:

forming a plurality of connectors for connecting said first semiconductor chip and said second semiconductor chip; and stacking said first semiconductor chip with said second semiconductor chip, wherein said first memory array acts as an AND array, wherein said plurality of columns act as product term lines, wherein said second memory array acts as an OR array, and wherein said plurality of columns act as product term lines.

35. The method of claim 34 wherein said steps (a), (b), (c) and (d) are performed concurrently with steps (e) and (f).

36. The method of claim 34 wherein said step of forming comprises forming a plurality of force-responsive self-interlocking microconnectors disposed on each of said first semiconductor chip and said second semiconductor chip.

37. The method of claim 36 wherein said plurality of force-responsive self-interlocking microconnectors provide both a physical and an electrical connection between said first semiconductor chip and said second semiconductor chip.

38. The method of claim 36 wherein said step of stacking comprises pressing said first semiconductor-chip together with said second semiconductor chip such that said plurality of force-responsive self-interlocking microconnectors interlock.

39. The method of claim 36 further comprising a step of forming at least one channel on each of said first semiconductor chip and said second semiconductor chip on which to form at least one of said plurality of force-responsive self-interlocking microconnectors.

40. The method of claim 34 wherein said step of forming comprises forming a plurality of metal bumps oppositely disposed on said first semiconductor chip and said second semiconductor chip.

41. The method of claim 40 wherein said step of stacking comprises providing a means for physically and electrically connecting said plurality of oppositely disposed metal bumps.

42. The method of claim 34, wherein said PLA logic circuitry resides on a face of said second semiconductor chip, wherein said first memory array and said second memory array reside on a face of said first semiconductor chip and wherein said step of stacking comprises stacking said first semiconductor chip and said second semiconductor chip.

\* \* \* \* \*

UNITED STATES PATENT AND TRADEMARK OFFICE
CERTIFICATE OF CORRECTION

PATENT NO. : 5,781,031
DATED : July 14, 1998
INVENTOR(S) : Bertin et al.

It is certified that error appears in the above-identified patent and that said Letters Patent is hereby corrected as shown below:

Col. 21, line 59, delete "each of aid first" and replace with --each of said first--.

Col. 24, line 26, delete "semiconductor-chip" and replace with --semiconductor chip--.

Signed and Sealed this

Twenty-ninth Day of December, 1998

Attest:

BRUCE LEHMAN

Attesting Officer     Commissioner of Patents and Trademarks